(12) United States Patent
Adachi et al.

(10) Patent No.: US 9,153,634 B2
(45) Date of Patent: Oct. 6, 2015

(54) LIGHT-EMITTING ELEMENT AND DISPLAY DEVICE USING SAME

(71) Applicants: Japan Display Inc., Tokyo (JP); Panasonic Liquid Crystal Display Co., Ltd., Himeji-shi, Hyogo (JP)

(72) Inventors: Masaya Adachi, Tokyo (JP); Kazutaka Tsuji, Tokyo (JP); Hajime Murakami, Tokyo (JP); Etsuko Nishimura, Chiba (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 14/589,237

(22) Filed: Jan. 5, 2015

(65) Prior Publication Data

US 2015/0108466 A1  Apr. 23, 2015

Related U.S. Application Data

(63) Continuation of application No. 14/327,098, filed on Jul. 9, 2014, now Pat. No. 8,928,221, which is a
(Continued)

(30) Foreign Application Priority Data

Dec. 12, 2002  (JP) ................................ 2002-360283

(51) Int. Cl.
*H05B 33/00* (2006.01)
*H05B 33/22* (2006.01)
(Continued)

(52) U.S. Cl.
CPC ........ *H01L 27/3265* (2013.01); *H01L 27/3246* (2013.01); *H01L 27/3248* (2013.01);
(Continued)

(58) Field of Classification Search
CPC ............ H01L 27/3265; H01L 51/5271; H01L 27/3258; H01L 27/3246; H01L 27/3248; H01L 51/5237
See application file for complete search history.

(56) References Cited

U.S. PATENT DOCUMENTS 5,834,893 A  11/1998  Bulovic
5,910,706 A   6/1999  Stevens
(Continued)

FOREIGN PATENT DOCUMENTS

JP  2001-332388  11/2001
JP  2002-202737   7/2002
(Continued)

OTHER PUBLICATIONS

Miyaguchi, et al, "Organic LED Full-Color Passive-Matrix Display", Journal of the SID 7/3, 1999, pp. 221-226.
(Continued)

*Primary Examiner* — Joseph L Williams
(74) *Attorney, Agent, or Firm* — Lowe Hauptman & Ham, LLP

(57) ABSTRACT

A display device includes a plurality of light-emitting elements aligned on a TFT substrate in a formation of a matrix. The plurality of light-emitting elements each have a flat surface portion and including a light-emitting layer, an anode, and a cathode, an insulating layer formed on the TFT substrate and under the light emitting element, and a tilted metal surface provided on a peripheral area surrounding the flat surface portion of the light-emitting element and having a tilt angle with respect to the flat surface portion of the light-emitting element. The tilted metal surface is provided on a surface of a slope of a bank that is provided on the insulation layer, and a width of a cross-section of the bank becomes smaller as the cross section comes farther away from a surface of the TFT substrate. A counter substrate is placed on the TFT substrate.

20 Claims, 32 Drawing Sheets

Related U.S. Application Data continuation of application No. 14/045,162, filed on Oct. 3, 2013, now Pat. No. 8,791,632, which is a continuation of application No. 13/477,590, filed on May 22, 2012, now Pat. No. 8,558,449, which is a continuation of application No. 13/206,915, filed on Aug. 10, 2011, now Pat. No. 8,193,697, which is a continuation of application No. 12/631,326, filed on Dec. 4, 2009, now Pat. No. 8,049,405, which is a continuation of application No. 11/852,153, filed on Sep. 7, 2007, now Pat. No. 7,812,515, which is a continuation of application No. 11/361,298, filed on Feb. 23, 2006, now Pat. No. 7,279,833, which is a continuation of application No. 10/653,623, filed on Sep. 2, 2003, now Pat. No. 7,030,556.

(51) Int. Cl.
    *H01L 51/52*     (2006.01)
    *H01L 27/32*     (2006.01)
    *H05B 33/04*     (2006.01)
    *H05B 33/14*     (2006.01)
    *H05B 33/02*     (2006.01)

(52) U.S. Cl.
CPC ........ *H01L27/3258* (2013.01); *H01L 51/5203* (2013.01); *H01L 51/524* (2013.01); *H01L 51/5237* (2013.01); *H01L 51/5271* (2013.01); *H01L 51/5275* (2013.01); *H05B 33/02* (2013.01); *H05B 33/04* (2013.01); *H05B 33/14* (2013.01); *H05B 33/22* (2013.01); *H01L 27/322* (2013.01); *H01L 27/3211* (2013.01); *H01L 27/3295* (2013.01); *H01L 51/5206* (2013.01); *H01L 51/5221* (2013.01); *H01L 51/5281* (2013.01); *H01L 2251/5315* (2013.01)

(56) References Cited

U.S. PATENT DOCUMENTS

| | | |
|---|---|---|
| 6,320,633 B1 | 11/2001 | Broer et al. |
| 6,828,725 B2 | 12/2004 | Kimura |
| 6,831,407 B2 | 12/2004 | Cok |
| 6,833,667 B2 | 12/2004 | Hamano et al. |
| 6,872,973 B1 | 3/2005 | Koyama et al. |
| 6,894,432 B2 | 5/2005 | Fujieda et al. |
| 6,906,452 B2 | 6/2005 | Ichikawa |
| 7,019,454 B2 | 3/2006 | Suzuki et al. |
| 7,030,556 B2 | 4/2006 | Adachi et al. |
| 2001/0020922 A1 | 9/2001 | Yamazaki et al. |
| 2002/0070663 A1 | 6/2002 | Ogura et al. |
| 2002/0084747 A1 | 7/2002 | Fujieda et al. |
| 2002/0101152 A1 | 8/2002 | Kimura |
| 2003/0164679 A1 | 9/2003 | Hamano et al. |
| 2004/0050232 A1 | 3/2004 | Lee |
| 2004/0056585 A1 | 3/2004 | Suzuki et al. |
| 2004/0160165 A1 | 8/2004 | Yamauchi |
| 2004/0211307 A1 | 10/2004 | Lee |
| 2005/0116620 A1 | 6/2005 | Kobayashi |
| 2005/0162356 A1 | 7/2005 | Koyama et al. |
| 2005/0257657 A1 | 11/2005 | Lee |
| 2005/0260337 A1 | 11/2005 | Ogura et al. |
| 2009/0015524 A1 | 1/2009 | Koyama et al. |
| 2010/0060620 A1 | 3/2010 | Yamazaki et al. |
| 2012/0306832 A1 | 12/2012 | Yamazaki et al. |
| 2014/0247256 A1 | 9/2014 | Yamazaki et al. |
| 2014/0253811 A1 | 9/2014 | Koyama et al. |

FOREIGN PATENT DOCUMENTS

| | | |
|---|---|---|
| JP | 2002-229482 | 8/2002 |
| JP | 2002-260844 | 9/2002 |
| JP | 2002-540458 | 11/2002 |
| JP | 2003-115392 | 4/2003 |
| JP | 2003-257659 | 9/2003 |
| JP | 2003-272873 | 9/2003 |
| JP | 2004-056585 | 2/2004 |
| JP | 2004-063404 | 2/2004 |
| JP | 2004-165017 | 6/2004 |
| JP | 2014-197204 A | 10/2014 |
| JP | 2015-065185 A | 4/2015 |
| JP | 2015-111276 A | 6/2015 |
| JP | 2015-129945 A | 7/2015 |
| WO | 98/28947 | 7/1998 |

OTHER PUBLICATIONS

Shimoda et al, "26.3: Multicolor Pixel Patterning of Light-Emitting Polymers by ink-Jet Printing" ISSN0099-0966X/99/3001, 1999 SID.
Tanaka, "Trend and Aspect of Organic EL Displays", The Journal of the Institute of Image Information and Television Engineers, (2000), vol. 54, No. 8, pp. 1115-1120.

EXPOSURE

LIGHT-EMITTING ELEMENT AND DISPLAY DEVICE USING SAME

CROSS-REFERENCE TO RELATED APPLICATIONS

This application is a continuation of application Ser. No. 14/327,098, filed Jul. 9, 2014, which is a continuation of application Ser. No. 14/045,162, filed Oct. 3, 2013, now U.S. Pat. No. 8,791,632, which is a continuation of application Ser. No. 13/477,590, filed May 22, 2012, now U.S. Pat. No. 8,558,449, which is a continuation of application Ser. No. 13/206,915, filed Aug. 10, 2011, now U.S. Pat. No. 8,193,697, which is a continuation of application Ser. No. 12/631,326, filed Dec. 4, 2009, now U.S. Pat. No. 8,049,405, which is a continuation of application Ser. No. 11/852,153, filed on Sep. 7, 2007, now U.S. Pat. No. 7,812,515, which is a continuation of application Ser. No. 11/361,298, filed on Feb. 23, 2006, now U.S. Pat. No. 7,279,833, which is a continuation of application Ser. No. 10/653,623, filed on Sep. 2, 2003, now U.S. Pat. No. 7,030,556, and claims the benefit of priority under 37 CFR 119 of Japanese application no. 2002-360283, filed on Dec. 12, 2002, all of which are incorporated herein by reference.

FIELD OF THE INVENTION

The present invention relates to a light-emitting element and a display device that presents picture images by controlling the light-emission operation of the light-emitting element, especially, to a technology that can be effective to such a light-emitting element as an organic light-emitting diode and to a display device equipped with the organic light-emitting diode.

BACKGROUND OF THE INVENTION

An organic light-emitting diode (abbreviated as OLED hereinafter) is a device that converts electric energy to light energy by injecting holes and electrons to a light-emitting layer constructed with an organic thin layer. A display device constructed with OLED (abbreviated as OLED display, hereinafter) is thin and lightweight because no additional light as backlight is required due to the self light-emitting capability. Furthermore, OLED displays have other features such as wide viewing angle and quick time-response in display characteristics.

FIG. 33 shows an example of an OLED construction and a substantial sectional view of the drawing that explains the display operation. This OLED is constructed with transparent electrode 200 functioning as an anode, hole transporting layer 103, light-emitting layer 102, an electron transporting layer 101, a reflective electrode 300 made of light-reflective metal that functions as a cathode on a transparent substrate 400, layered in this order. Once a DC voltage is applied between the transparent electrode 200 and the reflective electrode 300, the holes injected through the transparent electrode 200 travel in the hole transporting layer 103, and the electrons injected through the reflective electrode 300 travel in the electron transporting layer 101. Both holes and electrons reach the light-emitting layer 102 where electron-hole recombination occurs and a light with a certain wave length is emitted. A part of the light emitted from the light-emitting layer 102 is observed through the transparent substrate 400 by a viewer 1000. The light emitted roughly parallel to the boundary surface of the layers or the light that has a larger incident angle against the boundary surface than the critical angle between the two layers thereof, is propagated in parallel to the boundary surfaces, does not travel to the viewer and therefore they are not effectively used for display lights. The external coupling efficiency (the ratio of the amount of light extracted to the viewer 1000 and the emitted light from the light-emitting layer 102, or the ratio of the external quantum efficiency to the internal quantum efficiency) is generally estimated to be about 20% based on classical ray optics. The large amount of light generated at the light-emitting layers that travel in parallel to the boundary surface of the layers becomes a loss in the display system. Therefore, in order to realize low consumption power and a bright OLED, it is desirable to reduce the light guiding loss and to raise the external coupling efficiency.

The references as Patent 1 and Patent 2 shown below describe OLEDs that have reflection surfaces with tilted surfaces in order to reduce the guiding loss. For these cases, the description says the light emitted from the light-emitting layers travels in parallel or substantially parallel to the substrate or the layered film, is reflected at the tilted reflective surface and changes the traveling direction, which results in the reduction of light guiding loss and improvement of the external coupling efficiency.

REFERENCES

Patent 1: JP laid-open publication 2001-332388
Patent 2: JP domestic publication 2001-507503

FIG. 34 shows a cross sectional view of an example of OLEDs. As shown in FIG. 34, a portion of the light which is emitted from the organic layer 100, including the light-emitting layer, travels in parallel or substantially parallel to the substrate is reflected at the tilted reflective surface (shown as the tilted surface of the electrode 300) and then the propagation direction is closed to the viewer 1000. However the light that is emitted from the light-emitting layer and incident to the tilted reflective surface is a part of the light emitted from the light-emitting layer; therefore, a large part of the light is still lost and not effectively used. Furthermore, a portion of the light emitted from a pixel of the light-emitting layer is not incident upon the tilted reflective surface and travels into a different pixel, then incident to the tilted reflective surface formed in a different pixel and changing the direction to the viewer. This may cause an optical cross-talk and a blur of the display. Furthermore, as shown in FIG. 34, when the tilted reflective surface is used as an electrode for an element of OLED, disconnection occur at the electrode step levels over the tilted reflective surface.

To solve various problems as described above the light emitted from the light-emitting layer contributes much to the display light and realizes a bright display such that a high quality picture is provided as no blur is generated. Furthermore, other objectives of this invention are to provide fault free OLED that has no disconnection failure. The other purposes of this disclosure will be clarified in the following descriptions.

SUMMARY OF THE INVENTION

In order to achieve the above purposes, the display device having plurality of light-emitting elements that construct picture elements aligned on a substrate in a formation of a matrix, wherein the light-emitting element comprising a flat surface of a light-emitting layer made at least in a portion therein and a tilted reflective surface at least in a portion therein, of which the tilted reflective surface is made in the peripheral areas surrounding said surface of a light-emitting layer and has a tilt angle against the flat surface, wherein an optical waveguide layer is filled in an area surrounded by said tilted reflective surface on said light-emitting layer by which light generated at said light emitting layer is guided to the peripheral areas and wherein the optical waveguide layer is optically isolated from each picture element by the tilted reflective surface. Furthermore, the tilted reflective surface is on the surface of a slope formed by a bank that is on said substrate wherein cross sectional width of the bank is narrower against distance farther from surface of the substrate, therefore the optical waveguide layer has across sectional formation as a cross sectional width of the optical waveguide layer is wider against distance farther from a surface of the substrate.

In order to realize an optical waveguide layer that is optically isolated from the other picture elements, the height of the tilted reflective surface from the flat surface of the light-emitting layer is larger than the maximum height of the optical waveguide layer. In some embodiments, the optical waveguide layer is formed in a construction as the optical waveguide layer is isolated from the other optical waveguide layers for each picture element.

In an embodiment, the light-emitting element includes an organic light-emitting diode constructed with a reflective electrode configured as an optical reflector, a light-emitting layer comprising an organic layer and a transparent electrode stacked in order from the substrate. In an embodiment, the refractive index of the optical waveguide layer is larger than that of the air, and lower than that of the transparent electrode. Furthermore, a sealing material that is transparent against visible light and has gas barrier characteristics is set on a side of the light-emitting layer made on the substrate, wherein the substrate and the sealing material are adhesively bound with a gap that has substantially the same refractive index as the air.

In an embodiment, the light emitted from the light-emitting layer travels into the optical waveguide layer or passes through the transparent electrode after reflecting on the reflective electrode. A part of the light, among the light incident to the boundary between the optical waveguide layer and the air gap (we call the surface of the optical waveguide layer, hereinafter), is reflected with the smaller incident angle than the critical angle; however, most of the light travels to the viewer and passes through the air gap and the sealing material. On the other hand, the part of the light, among the light incident to the optical waveguide layer, which has a larger incident angle to the surface of the optical waveguide layer is totally reflected at the surface of the optical waveguide layer, and travels within the optical waveguide layer in parallel to the substrate. The light traveling in the optical waveguide layer approaches the tilted reflective surface and the propagation direction is changed by the reflection thereon; and the light that is incident to the surface of the optical waveguide layer with a smaller incident angle than the critical angle partially propagates towards the viewer and is effectively used as the display image light.

In an embodiment, the light guided in parallel to the substrate and is regarded as light loss in conventional technologies, is guided to the tilted reflective surface in a good efficiency and the light extracting ratio is improved. In this embodiment, since the optical waveguide layer is at least isolated from each other by each picture element, the light emitted from the light-emitting layer is not guided to the different picture elements. Thus, a display with high picture-quality is realized without degrading picture-quality seen in optical cross-talk or blur.

PREFERRED EMBODIMENT OF THE INVENTION

Hereinafter, exemplary embodiments will be discussed in conjunction with the drawings as needed.

The First Embodiment

Figure 1:
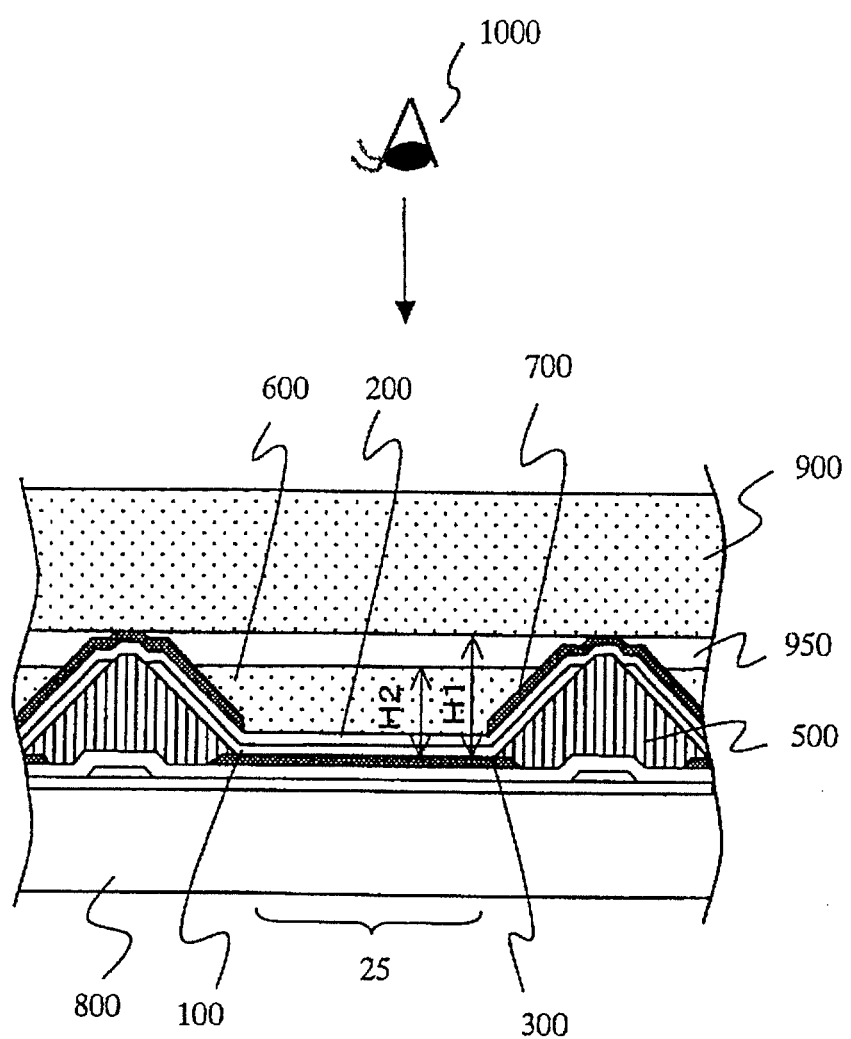
FIG. 1 is a cross sectional view of a picture element of the first embodiment of the display device.
Figure 2:
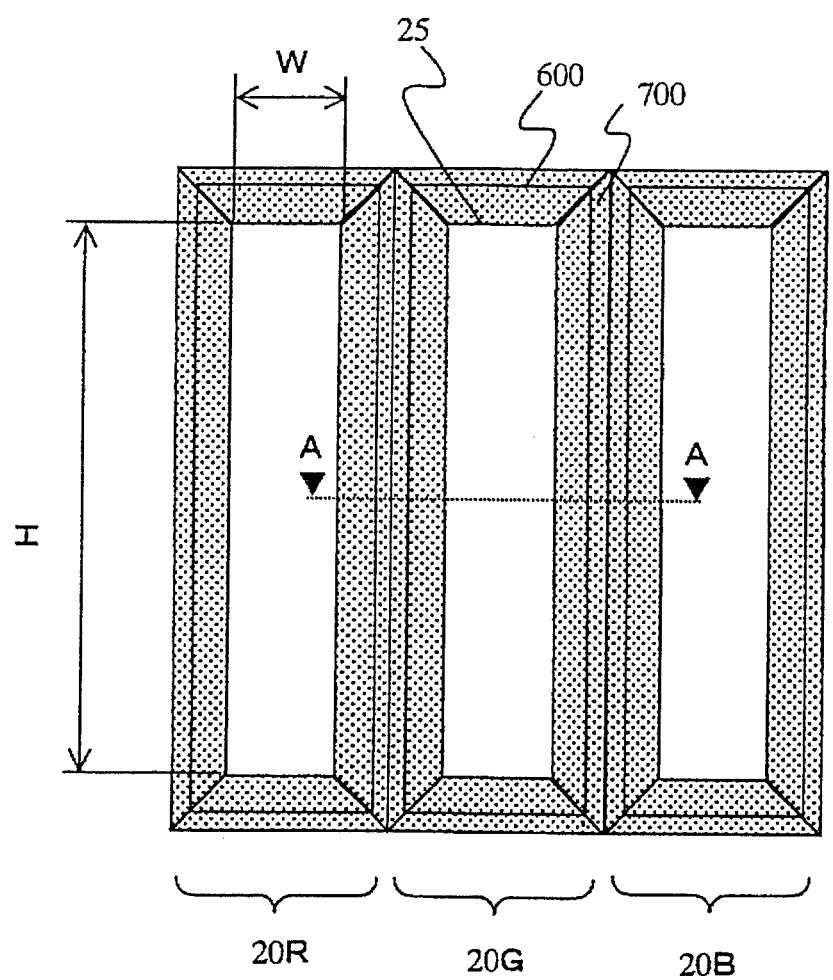
FIG. 2 is a plan view of the first embodiment of the display device.

FIG. 1 shows the cross sectional view of one picture element explaining the first embodiment. FIG. 2 shows another drawing explaining the first embodiment. FIG. 1 corresponds to the cutaway view along the line of A-A in FIG. 2. One color picture element includes three picture elements of red-light-emitting picture element 20R, green-light-emitting picture element 20G and blue-light-emitting picture element 20B, which are arranged in side-by-side as shown in FIG. 2 and the predetermined color is presented by additive color mixing of the lights emitted from these three picture elements. In addition, these picture elements 20R, 20G and 20B are called unit picture elements or sub-pixels, and a unit picture element corresponds to a mono-chromatic picture element for the case of mono-chromatic display device.

For the display device, wires, switching elements, storage capacitors and insulating layers are formed on the substrate as appropriate, even though they are not shown in the drawings. Reflective electrodes 300 include conduction material with optical reflecting characteristics that are formed on the substrate in an island shape as corresponding to the picture element, and banks 500 made of insulator material are formed to the edges of reflective electrodes 300 at the peripheral areas thereof. The bank 500 has a cross sectional formation in a shape as the width is getting narrow as getting farther from the substrate 800 and has tilted surfaces at its side areas. On the part of the tilted surface and the reflective electrode, an organic layer 100 that includes the light-emitting layer formed in each picture element in a form of an island and a transparent electrode 200 is formed thereon.

The transparent electrode 200 and the reflective electrode 300 are configured as an anode (or cathode) and a cathode (or anode), respectively and include an organic light emitting diode with an organic layer 100 formed on these electrodes. The organic layer 100 is constructed in three layered forms, as an electron transporting layer, a light-emitting layer and a hole transporting layer in order from the cathode side, or in two layered form, as a single layer functioning as light-emitting and electron transporting by using a material of dual use. Furthermore, in an embodiment, the organic light emitting diode, includes an additional anodic buffer layer between the anode and the hole transporting layer.

A tilted reflective surface 700 including of optical reflective metal is formed on the transparent electrode 200 at the location corresponding to the surface of a slope formed by a bank 500. Furthermore, an optical waveguide layer 600 is transparent to visible light and includes a material that has a larger refractive index than that of air, and is filled in the basin-like area surrounded by the tilted reflective surface 700. Moreover, since the organic layer 100 is usually degraded by the moisture included in the air, in an embodiment, organic layer 100 is sealed by a seal-off means from the open air so that it is not exposed to the open air. In this embodiment, bank 500 is a as spacer, and a seal-off material 900 and the substrate 800 are fixed by an adhesive seal material cemented in a frame-like form around the display portion of the display device.

A glass plate, a plastic film post-processed for gas barrier or a layered plate with thin glass and plastic film can be used for the seal-off material 900. For this construction, it is important to set a gap 950 which has the similar refractive index to the air between the seal-off material 900 and the optical waveguide layer 600. Because if the seal-off material 900 and the optical waveguide layer 600 contact each other, then the light emitted from the organic layer 100 and propagating in the optical waveguide layer 600 comes into the seal-off material 900 and does not come up to the viewer 1000, resulting in a loss or travels into other picture element, and comes up to the viewer 1000 thereafter as resulting into, problems of cross-talk and blur.

Inert gas as nitrogen gas may be enclosed in the gap 950, and the assembly is performed as nitrogen gas is enclosed and the seal-off material and the substrate 800 are bound in air-tight. Furthermore, in an embodiment, setting gap 950 is configured such that the optical waveguide layer 600 does not contact the seal-off material 900, and gap 950 should be set larger than the distance over which the light cannot travel from the optical waveguide layer 600 to the seal-off material 900 (due to the tunneling phenomenon of photons). Since the tunneling phenomenon occurs for a gap shorter than the wavelength of visible light, in an embodiment, the gap 950 is more than 1 μm.

Moreover, in some embodiments, it is important to keep the height H2 (from a flat surface 25 of the organic light emitting diode) from the reflective electrode 300 to the optical waveguide layer 600, smaller than the height H1 at the upper end of the tilted reflective surface 700. The reason is from optical cross-talk and blur that are caused by light emitted from the organic layer 100 traveling in the optical waveguide layer 600 may propagate over the tilted reflective surface 700 when the height H2 of the optical waveguide layer 600 is larger than the height H1 of the tiled reflective surface 700, and invade into different picture elements and then externally travel therefrom. Furthermore, for embodiments when the flat seal-off material 900 is set as the bank 500 used as a spacer, the optical waveguide layer 600 contacts the seal-off material 900 unless H1>H2 is kept then the light invading from the optical waveguide layer 600 to the seal-off material 900 causes problems as reduction of the external coupling efficiency, optical cross-talk and blur.

Figure 3:
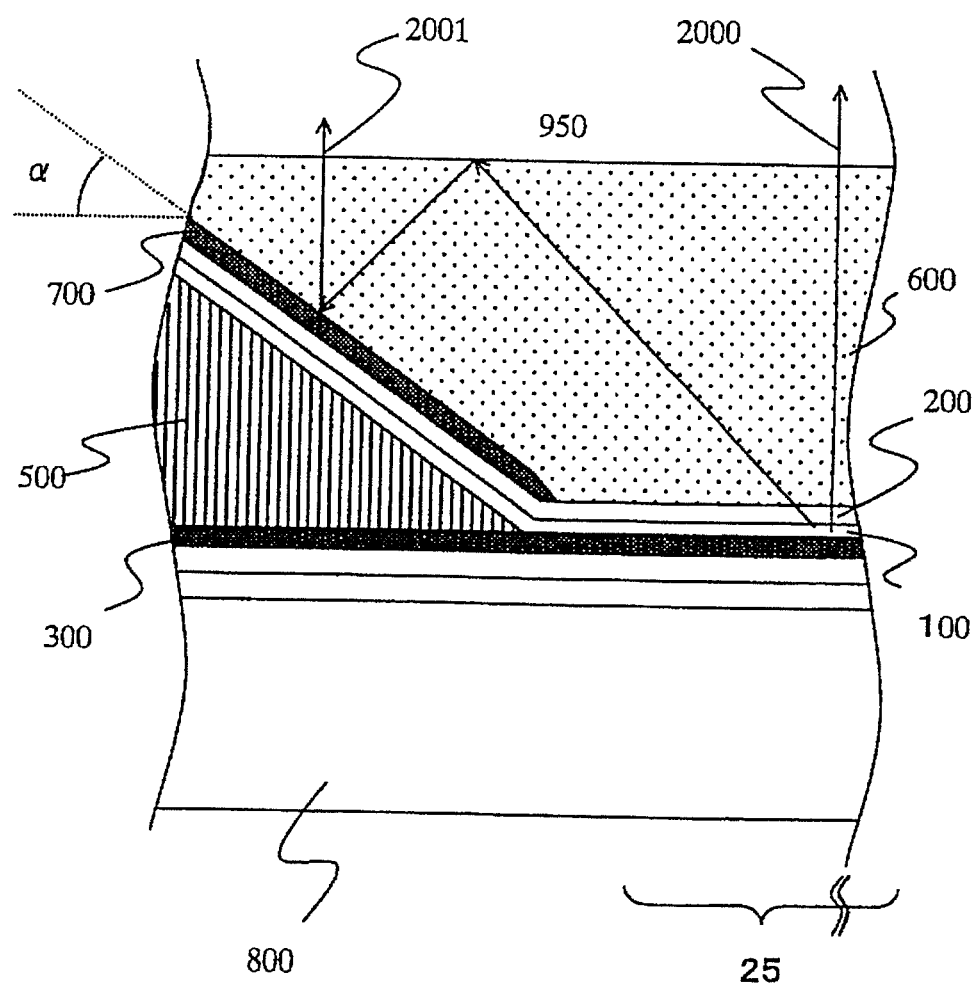
FIG. 3 is a cross sectional view of an example of operation of the first embodiment of the display device.

FIG. 3 is a cross sectional view of an example of operation for the first embodiment of the display device. Once DC voltage is applied to the transparent electrode 200 and the reflective electrode 300 in response to the picture signal, the holes injected through the anode travel in the hole transporting layer and electrons injected through the cathode travel in the electron transporting layer, respectively, and both holes and electrons reach the emitting layer. The recombination of an electron and a hole occurs in the emitting layer and light emission occurs. The light emitted from the light emitting layer that constructs the organic layer 100 comes into the optical waveguide layer 600 through the transparent electrode 200 as is emitted or after reflected at the reflective electrode 300. The lights, among the lights coming into the optical waveguide layer 600, that come to the boundary between the optical waveguide layer 600 and the gap 950 with a smaller incident angle than the critical angle is partially reflected but most of the reflected light travels up to the viewer, after passing through the gap 950 and the seal-off material 900 which is not shown, and are used as display image lights 2000.

On the other hand, the light travelling onto the surface of the optical waveguide layer 600 with a larger angle than the critical angle is totally reflected at the surface of the optical waveguide layer 600 and propagates in the optical waveguide layer 600 in parallel to the surface of the substrate 800. The light traveling in the optical waveguide layer 600 approaches the tilted reflective surface 700, and the direction of propagation changes by the reflection; a part of the light that comes into the surface of the optical waveguide layer 600 with a smaller incident angle than the critical angle travels to the viewer and is effectively used as display image light 2001. In other words, the light traveling in parallel to the substrate 800 which results in a loss in conventional technology, but in the embodiment, is led to the tilted reflective surface 700 by the optical waveguide layer 600 and changes the propagation direction by the reflection at the tilted reflective surface 700. Then, since the light is effectively used as the display image light, the external coupling efficiency has been improved. For this case, since the optical waveguide layer 600 is completely isolated, the light emitted from an organic layer of a certain picture element does not propagate in other different picture elements and optical cross-talk or blur of presentation occurs.

The improvement of the external coupling efficiency by suppressing the light loss due to above the propagation increases as the ticker optical waveguide layer in comparison to the area of the light-emitting portion is made. In other words, though the portion of the flat surface 25 is the light-emitting area, the thicker the optical waveguide layer 600 is, the higher the external coupling efficiency can be.

The light guided in the optical waveguide layer 600 mainly travels to the tilted reflective surface 700 with repeating the reflection at the surface of the optical waveguide layer 600 and that at the reflective electrode 300. For this case, since the reflectance of the reflective electrode 300 is not 100%, usually, the light is partially absorbed and lost by the reflective electrode. Therefore, if the number of times the reflection at the reflective electrode 300 until the light in the optical waveguide layer 600 comes to the tilted reflective surface 700 can be reduced, the optical loss by the reflective electrode 300 becomes less and high efficiency of the light extraction from the display can be obtained. Moreover, since no guiding of the light in the optical waveguide layer can provide no improvement of external coupling efficiency, the thickness of the optical waveguide layer should be larger than the wavelength of the light so that the good propagation of the light is obtained. In an embodiment, the thickness of the optical waveguide layer is larger than 1 μm.

As shown in FIG. 2, if the length H in the up-down orientation is longer than the length W in the left-right orientation in the plane of the emitting area, then the relation as (H2/W)>(H2/H) is obtained. In this embodiment, the external coupling efficiency for the left-right orientation is greater than that for the up-down orientation and the viewing angle is wider in the right-left orientation than in the up-down orientation. The wider viewing angle in the right-left orientation is preferred than that of the up-down orientation, and the limited light has to be provided to the viewers. In other words, the conventional OLED displays have has an isotropic viewing angle for the light intensity which is uniform for every direction; however, an embodiment can control the viewing angle characteristics of the light intensity by controlling the ratio of the thickness of the optical waveguide layer to the length of the light emitting area for the specific orientation. Therefore, we can realize the optimum light intensity characteristic for each particular application of the display devices.

Figure 4:
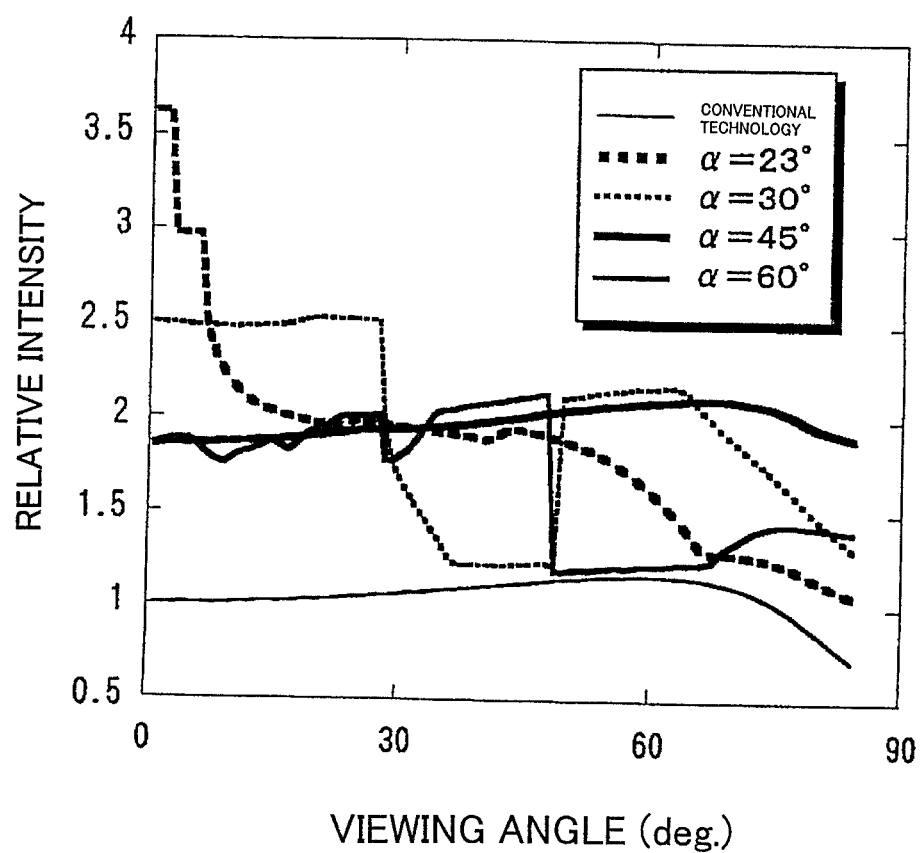
FIG. 4 is an explanatory schematic that shows the estimation of the viewing angle characteristics of the light intensity against the slope angle $\alpha$.

The viewing angle characteristics against the light intensity can be controlled by the tilt angle .alpha. of the tilted reflective surface 700 against the surface (substrate surface) that is a flat surface 25 in on embodiment. FIG. 4 shows the schematics diagram of the viewing angle characteristics against the light intensity as a function of the tilt angle α of the tilted reflective surface 700. FIG. 4 is provided for the case of the ratio H2/W=0.1 for the length W (see FIG. 2) of the light emitting area and the thickness H2 of the optical waveguide layer 600 (see FIG. 1) and the refractive index 1.5 for the optical waveguide layer and shows the estimation results for a two-dimensional model. The horizontal axis shows the viewing angle and the vertical axis shows the relative light intensity normalized to the light intensity obtained at the front position (intensity at 0° viewing angle) by the conventional OLED that has a flat and plane layered construction. As shown in this diagram, the viewing angle characteristics of the light intensity can be changed by changing the tilt angle α. For example, we can see a high light intensity at the front direction and the adjacent direction is obtained for α=23°~30°, almost constant light intensity characteristics for wide range of viewing angle for α=45°, and the viewing angle characteristics decreasing over a 50° viewing angle for α=60°.

The tilted reflective surface is not the slope surface constructed in a complete flat surface for actual cases, the tilt angle α tends not to be constant over the tilted reflective surface and to constantly vary in accordance with the location of the tilted reflective surface. Therefore, in applications where the display device is used in portable phones, which a single person mostly uses at a time, wide viewing angle is not required, but high intensity at the front direction is preferred. Therefore, in the embodiments, the average angle values for the tilt angle α should be about as 20° ~30°, and the higher intensity at the front orientation in comparison to the inclined orientation against the front orientation. However, in embodiments where the wider viewing angle and the brighter picture image are utilized, with the average value of a approximately equal to 45° for TV set applications, where the display is watched by many people. In addition, since the present estimation is the calculated result provided in a limited condition under a simple two-dimensional model, the result is not be used for an exact quantitative evaluation, but is effective as a relative evaluation for a qualitative study.

Figure 5:
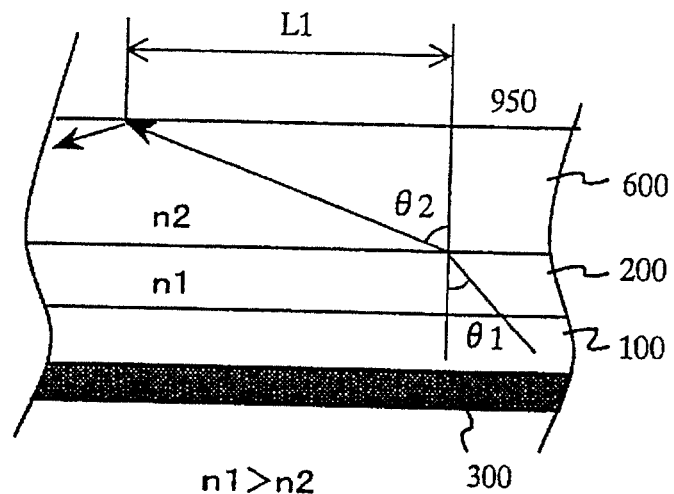
FIG. 5 is an explanatory schematic of the light traveling in the optical waveguide layer when the refractive index of the optical waveguide layer is smaller than that of the transparent electrode.
Figure 6:
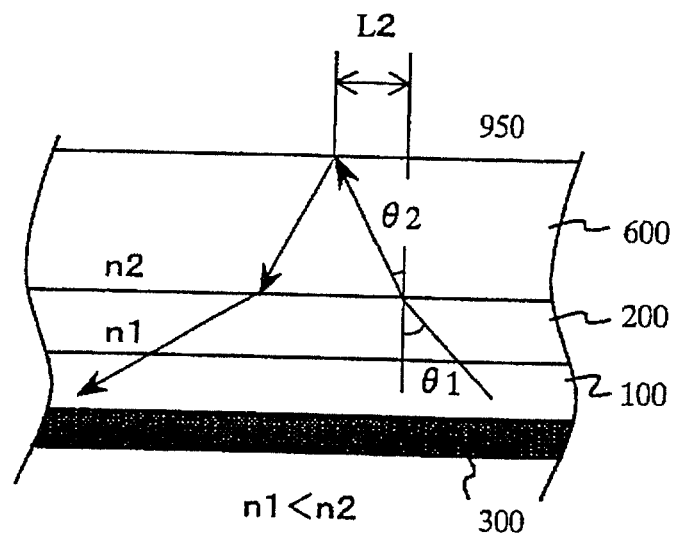
FIG. 6 is an explanatory schematic of the light traveling in the optical waveguide layer where the refractive index of the optical waveguide layer is larger than that of the transparent electrode.

Next, we explain the relation between the refractive indices of optical waveguide layer 600 and transparent electrode 200. FIG. 5 and FIG. 6 are the schematics to explain the effect against the external coupling efficiency. FIG. 5 is where the refractive index of the optical waveguide layer is smaller than that of the transparent electrode, and FIG. 6 is when the refractive index of the optical waveguide layer is larger than that of the transparent electrode. Once we define the refractive index of the transparent electrode n1, that of the optical waveguide layer n2, incidental angle θ1 of the light from the transparent electrode to the optical waveguide layer and refraction angle θ2, we obtain sin θ1/sin θ2=n2/n1 from Snell's law. Therefore, when the refractive index n1 of the optical waveguide layer 600 is smaller than the refractive index n2 of the transparent electrode, the refraction angle θ2 is larger than the incident angle θ1.

On the other hand, when the refractive index n1 of the optical waveguide layer 600 is larger than the refractive index n2 of the transparent electrode, the refraction angle θ2 is smaller than the incident angle θ1. Therefore, if we define the propagation distance without reflection in the optical waveguide layer 600 as L1 when n1>n2 and L2 for n1<n2, then L1 is larger than L2. The fact that the propagation length without reflection of the light traveling in the optical waveguide layer 600 is long implies that the times of reflection at the reflective electrode 300 until the light traveling up to the tilted reflective surface 700, means the light loss of the absorption by the reflective electrode becomes less. For this reason, in some embodiments, the refractive index of the optical waveguide layer is less than that of the transparent electrode for the purpose of improving the external coupling efficiency. It should be noted that a critical angle exists between the transparent electrode 200 and the optical waveguide layer 600, and the light with a larger incident angle from the transparent electrode to the optical waveguide layer is totally reflected and is not transmitted to the optical waveguide layer 600.

In contrast, the critical angle does not exist for the case of n1<n2, therefore the incident angle which even becomes to be the critical angle for the case of n1>n2, the light is transmitted from the transparent electrode to the optical waveguide layer. However, since such a light is totally reflected at the surface of the optical waveguide layer 600 and returns back to the reflective electrode 300, the light is repeatedly reflected by the surface of the optical waveguide layer 600 and the reflective electrode 300, and is lost by the attenuation. To prevent this phenomenon, it is necessary to increase the thickness of the optical waveguide layer by which the number of reflections of the light at the reflective surface 300 can be reduced, until the light reaches the tilted reflective surface 700 while traveling in the optical waveguide layer. However, in general, the refractive index of the transparent electrode 200 is rather high as 1.8 to 2.2 and it takes a long time to form a transparent material (titanium oxide, for instance) that has a larger refractive index than this in a thickness of an order of micron meters without damage to the organic layer therefore such formation is not industrially practical. Therefore, it is desirable that the refractive index of the optical waveguide layer should be larger than that of air, and less than that of the transparent electrode, and the optical waveguide layer is made of a transparent plastic material that is relatively formed in ease. In some embodiments, the refractive index of the optical waveguide layer is 1.3 to 1.7.

Figure 7:
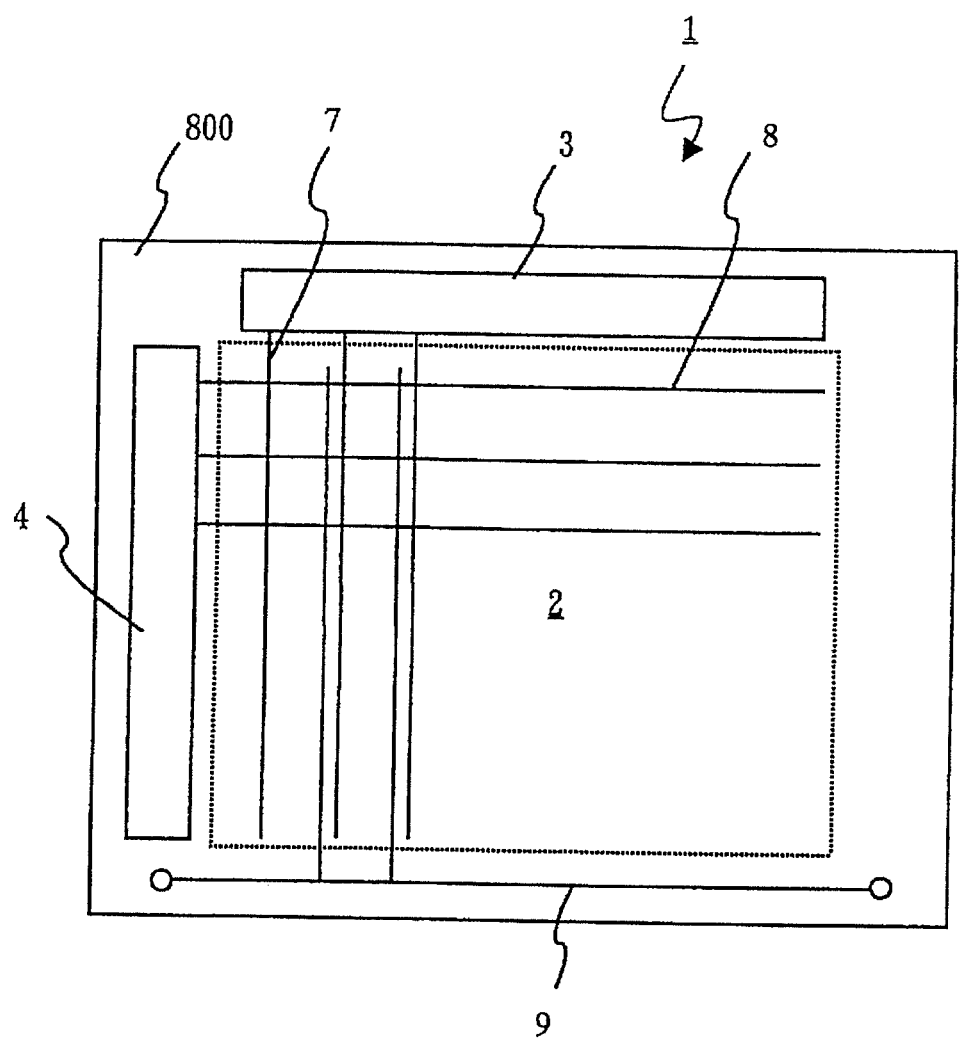
FIG. 7 is a block diagram showing the whole layout of the embodiment of the display device.
Figure 8:
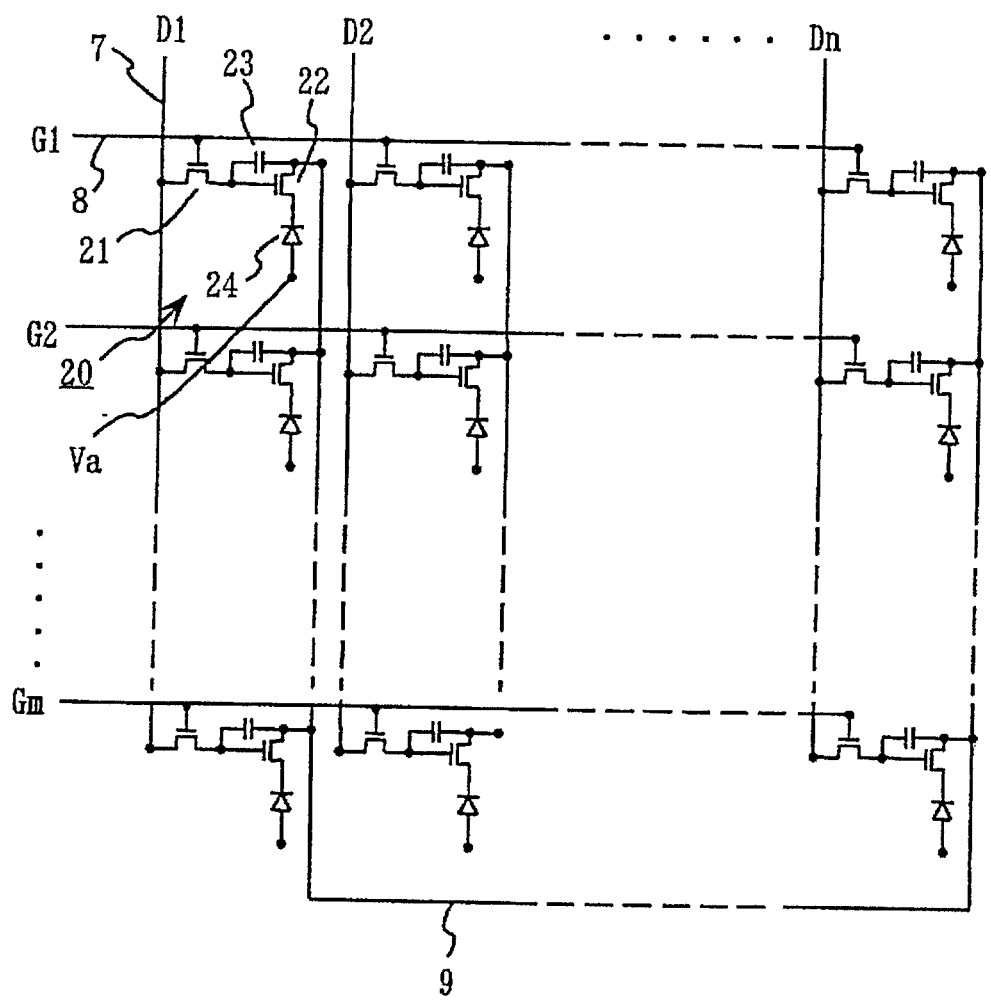
FIG. 8 is an equivalent circuit diagram of the active matrix of the display device shown in FIG. 7.

Next, we explain an embodiment of the display device with reference to the schematics. FIG. 7 shows a schematic of the whole layout of the embodiment. FIG. 8 is an equivalent circuit of the active matrix constructed on the display portion 2. As shown in FIG. 7, the display device 1 has a display portion 2 at substantially the center of the substrate 800. In this display portion 2, a data driver circuit to output the picture signals to a plurality of data lines 7 is constructed in the upper part of the display portion and a scan driver circuit to output the scan signals to a plurality of gate lines 8. The driver circuits 3 and 4 comprise shift register circuits, level shifter circuits and analog circuits which include P channel and N channel TFTs (Thin Film Transistors) in a complementary configuration. The line 9 is a common voltage line.

In an embodiment, display device 1 is similar to active matrix liquid crystal display devices such that a plurality of gate lines and data lines cross each other in the direction of the expansion, and the picture element 20 is located at each cross point of gate lines G1, G2, . . . , Gm and data lines 01. 02, . . . , On. Each picture element includes a light-emitting element 24 including an OLED, storage capacitor 23, a switching transistor 21 of an N channel TFT of which the gate electrode is connected to the gate line, either a source or a drain electrode is connected to the data line and the other is connected to the storage capacitor 23, and a driver transistor 22 of an N channel TFT of which the gate electrode is connected to the storage capacitor 23, the source electrode is connected to the common voltage line 9 extending in the same direction as the data lines and the drain electrode is connected to the cathode of an OLED that is the light-emitting element 24. Moreover, the anode of an OLED of a light-emitting element 24 is connected to a current supply line commonly used for all picture elements and kept at the same voltage Va. The light-emitting element 24 emits any of red-, green- or blue-lights and is aligned in a predetermined order in a matrix formation.

In the above construction, once the switching transistor 21 is in an "ON" state, then the picture signal is written in the storage capacitor 23 through the switching transistor 21. Therefore, the gate electrode of the driver transistor 22 is kept at a voltage corresponding to the picture signal by the storage capacitor 23 even if the switching transistor 21 is set to "OFF" state. The driver transistor 22 is kept in a source follower mode which features constant current characteristics and the light-emitting operation is maintained since the current from the current supply line flows to the organic light-emitting diode that forms the light-emitting element 24. For this embodiment, the intensity of the emitted light depends on the data written in the storage capacitor 23. The cease of the emission is realized by setting the driver transistor 22 "OFF" state.

Figure 9:
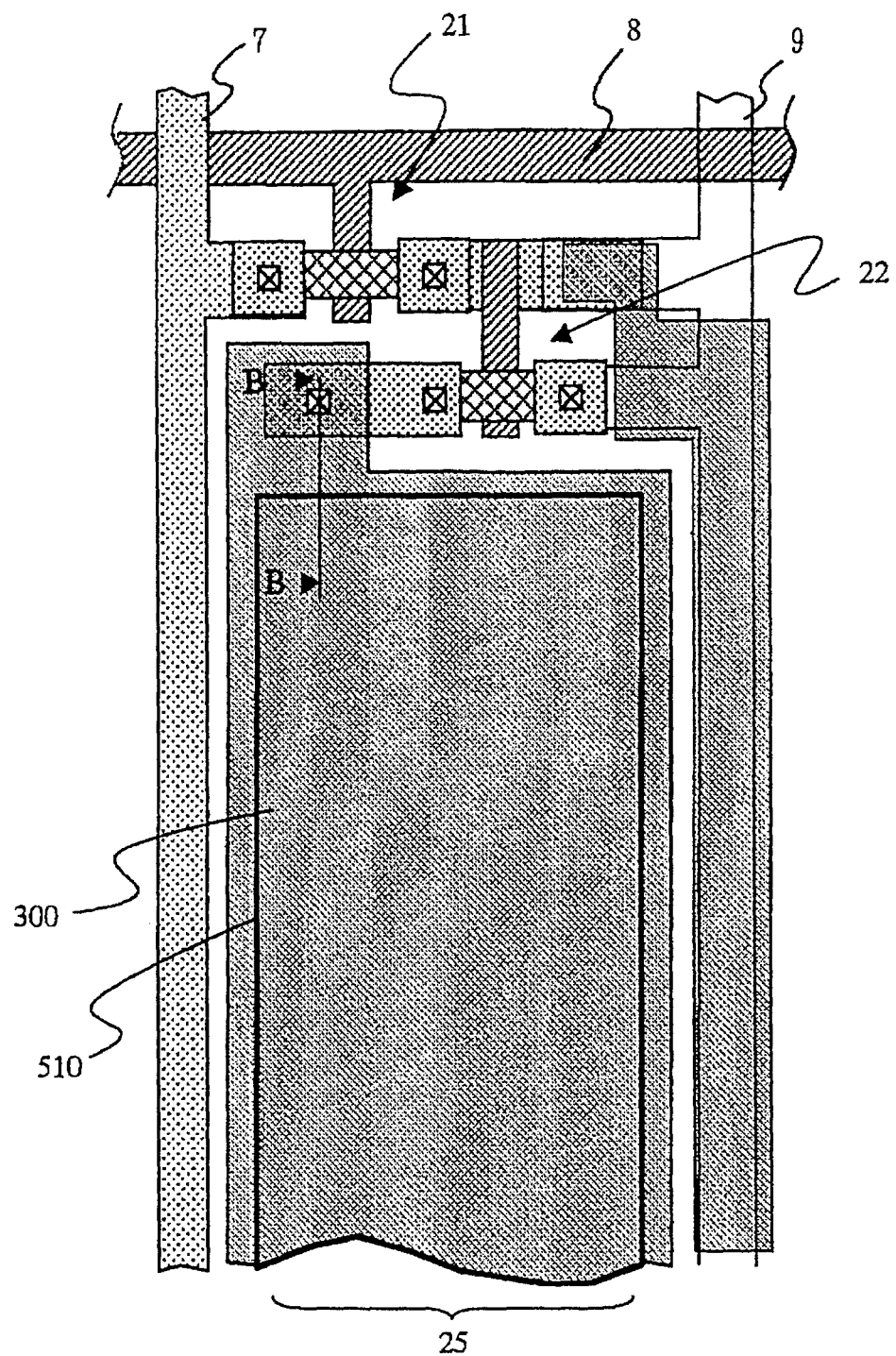
FIG. 9 is a layer drawing of the picture element of the embodiment of the display device.
Figure 10:
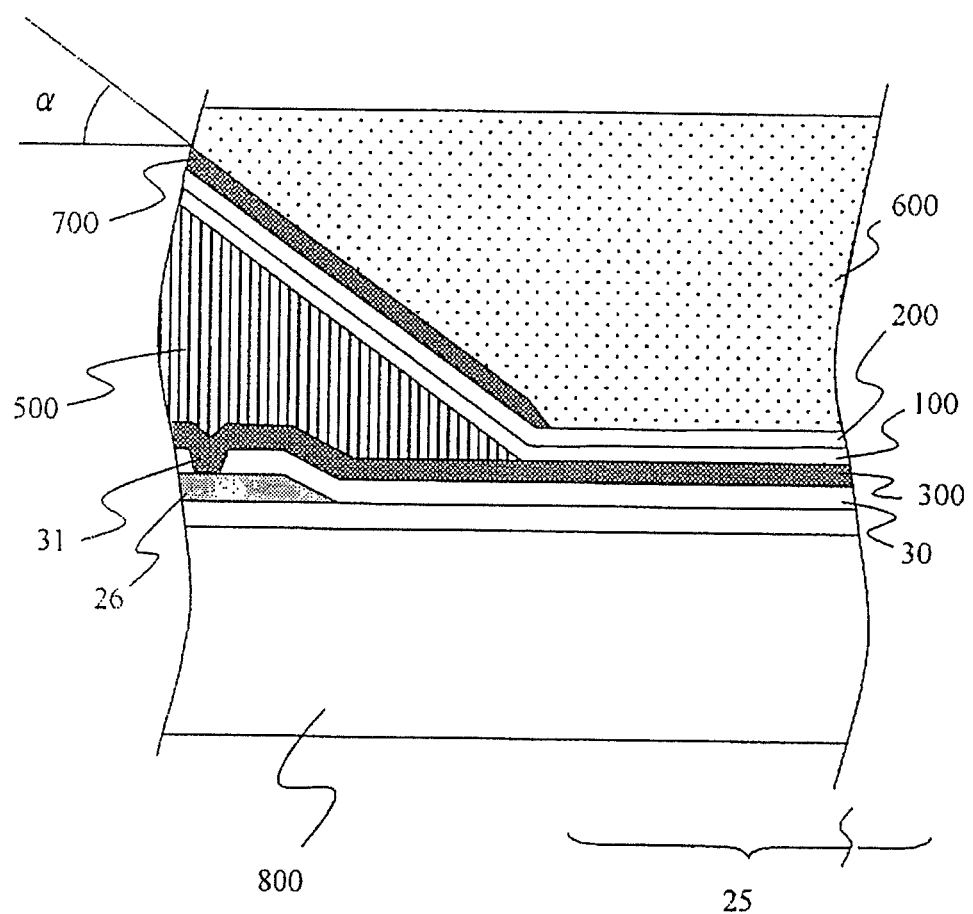
FIG. 10 is a cutaway view along 8-8 line shown in FIG. 9

We explain the construction of the display device regarding the first while referring to a combination of FIG. 9 and FIG. 10 and that of FIG. 1 and FIG. 2. FIG. 9 is a layer drawing of the picture element showing the constructing layers. FIG. 10 shows a cutaway view along the line B-B in FIG. 9. The display device in this embodiment is constructed include that driver elements (thin film transistors in this embodiment) include switching transistors and driver transistors and elements connected to those driver elements as gate lines, data lines, a common voltage line and storage capacitor, are formed on a flat substrate 800 as glass and insulation layer 30 is formed thereover. On the insulation layer 30, a reflective electrode 300 that functions as a cathode of the light-emitting element 24 is formed in a shape of an island and the reflective electrode 300 is connected to the drain electrode 26 of the driver transistor by a contact hole 31 opened in the insulation layer 30.

In this embodiment, the reflective electrode 300 functions as a cathode. For the cathode, the metals of low work function as aluminum, magnesium, magnesium-silver alloy; aluminum-lithium alloy, etc. can be used. Since the configuration of a single metal layer using aluminum needs high driving voltage and the life-time of the display device is short, a ultra-thin film of Li compound (as lithium oxide Li2O, lithium fluoride LiF) formed between the reflective electrode and the organic layer may be used which equivalently functions as aluminum-lithium alloy. Alternatively, the cathode surface contacting the organic layer is doped with a high reactive metal such as lithium or strontium and then the low drive voltage is obtained. In some embodiments, the reflective electrode is made of highly optical reflective material in order to obtain the high usage efficiency of the light for viewing image.

In the area on which driver elements and signal lines are formed, a bank 500 which overlays these elements and lines, and surrounds the flat area of the reflective electrode 300 is formed thereon. In this embodiment, the bank 500 is formed to cover the contact hole 31. In other words, the contact hole is aligned and formed underneath the bank. This helps to realize higher intensity of light emission because a step difference exists on the contact hole 31 resulting in a no use area against light emitting area and the wider light-emitting area is obtained by arranging the no light emitting area under the bank area. Moreover, in some embodiments, the bank is formed to overlay the peripheral part of the reflective electrode 300. Because the organic layer 100 and the transparent electrode 200 are cracked by the step difference of the reflective electrode 300 at the peripheral part such that the transparent electrode 200 is electrically broken and/or the reflective electrode 300 and the transparent electrode 200 are electrically shorted. Instead of these problems, the overlay forming of the bank, therefore, prevents such incidental troubles.

The bank 500 can be formed by patterning an insulator material with photolithography technology. Inorganic material such silicon oxide, silicon nitride or dielectric material such as acrylic resin and polyimide resin may be used. In addition, in some embodiments, the height of the bank is more than a few micron meters in order to realize high external coupling efficiency since the dimension of the bank 500 determines the height of the tilted reflective surface 700 and the thickness of the optical waveguide layer 600. The organic material is used for the dimensional height of the bank formed in a short time processing. The cross sectional view of the bank 500 has a trapezoidal shape so that the horizontal width is less while the height is farther from the substrate and the side surfaces of the bank has an arrangement into a tilted surface against the substrate surface. Moreover, the bank 500 may be made by other processes to form the designed tilted surface using a screen printing method or a direct printing such as the ink-jet printing.

The organic layer 100 has a light-emitting layer that emits each of red, green and blue lights is patterned in each predetermined position for each picture element in a shape of an island. A transparent electrode 200 functioning as an anode is formed over the display portion 2. The transparent electrode material that has a high work function includes, for example, ITO (Indium Tin Oxide) or IZO (Indium Zinc Oxide).

The transparent electrode 200 is connected with the current supply line. For the organic layer 100, a material that emits the light in a designed color is used and the construction of three layers includes an electron transporting layer, a light-emitting layer and a hole transporting layer or two layers includes a material which supports both a light-emitting layer and an electron transporting layer and a hole transporting layer.

In some embodiments, a red light emitting material includes triphenyldiamine derivative TPD (N,N'-bis(3-methylphenyl)-N,N-diphenyl-[1,1'-biphenyl]-4,4'-diamine) or α-NPD (4,4'-bis[N-(1-naphthyl)-N-phenylamino]biphenyl) and DCM-1(4-dicyanomethylene-6-(p-dimethylaminostyryl)-2-methyl-4-H-pyran) distributed Alq3 (tris(8-quinolinolate)aluminum) for the electron transporting light-emitting layer (dual usage for an electron transporting layer and a light emitting layer).

In some embodiments, a green light emitting material includes triphenyldiamine derivative TPD or α-NPD for hole transporting layer and Alq3 or quinacridon-doped Alq3 or Bebq (bis(8-hydroxy quinolinate)beryllium) for the electron transporting light-emitting layer (dual usage for an electron transporting layer and a light emitting layer).

In some embodiments, a blue light emitting material includes TPD, α-NPD for the hole transporting layer and DPVBi (4,4'-bis(2,2-diphenylvinyl)biphenyl) or a material consisting of DPVBi and BCzVBi (4,4'-bis(2-carbazolevinylene)biphenyl) or a material doped with distyrylallylene derivative as a host and distyrylamine derivative as a guest for the light emitting layer and Alq3 for the electron transporting layer. In some embodiments, Zn(oxz)2(2-(0-hydroxyphenyl)-benzoxazole zinc complex) is/used for the electron transporting light emitting layer (dual usage for an electron transporting layer and a light emitting layer).

Moreover, we can use materials of polymer system instead of the above material of a low molecular-weight system. In some embodiments, for the polymer base materials, we can use multiple-layer film of PEDT/PSS (a mixed layer of Polyethylene dioxy thiophene and Polystyrene sulphonate) and PPV (poly(p-phenylene vinylen)) for the hole transporting layer and the light emitting layer. In some embodiments, we can use green ink blended PPV for green color light emission, rhodamine 101 blended green ink as a dopant for red-color light emission and F8 (Poly(dioctylfluorene)) for a blue color light emitting layer. In addition, F8 can function as an electron transporting layer. In some embodiments, we can use dye containing polymer such as PVK (poly(N-vinylcarbazole)). In some embodiments, each layer of the multiple layer film is on the order of several tens of nano meters which is less than the wave length of light.

In some embodiments, for the patterning of the organic layer 100 in each predetermined position for each picture element in a fashion of an island, we can use a published technology as pattered-film forming technology used for deposited organic layer through shadow masks (for instance, S. Miyaguchi, et al.: "Organic LED Fullcolor Passive-matrix display", Journal of the SID, 7, 3, pp 221-226 (1999)). In this process, the bank 500 can be used as a spacer of the shadow masks. When the organic layer 100 is made of a material of a polymer system, we can use published ink-jet technology (for example, T. Shimada, et al.: "Multicolor Pixel Patterning of Light-Emitting Polymers by Ink-Jet Printing", SID 99 DIGEST, 376 (1999)). In this process, the bank 500 functions as a torus isolating the picture element area.

A tilted reflective surface 700 is formed on the surface of the slope of the bank 500, and is on the transparent electrode 200. The tilted reflective surface 700 is formed by a high reflective metal such as aluminum, silver or chrome in the process of deposition through masks or in the photolithographic patterning processing. In addition, the following effect can be obtained when the tilted reflective surface is made of a metal film. In general, the transparent electrode has a higher electrical resistivity than a metal electrode. Therefore, the display device which has a large display size tends to have the voltage difference due to the electrical resistivity between the location close to the power supply and far from it. Due to this voltage difference, the electric current flowing into the OLEDs including the picture element differs among those close to the power supply and far from it, resulting in the lack of uniformity in the intensity of emitted light. For this problem, by forming the tilted reflective electrodes made of a metal that directly contacts the transparent electrodes, the tilted reflective electrodes works as low resistive electrodes arranged thereon in a meshed formation, and the effect is to suppress the lack of uniformity of emitted light.

For the tilted reflective surface 700, a multiple layered film using a transparent dielectric material such as silicon oxide, silicon nitride or titanium oxide may be formed for the reflective surface. For this embodiment, we obtain a feature of loss less reflective surface against the light reflection, but drawbacks from a longer manufacturing process and the reflectivity dependence against the wavelength and the tilt angle that are subject to the issues to be studied. In the flat surface surrounded by the tilted reflective surface 700, an optical waveguide layer 600 is formed with a transparent material. The optical waveguide layer 600 is made of a lower refractive material than that of the transparent electrode 200. For this embodiment, after a liquid-repellent process to the tilted reflective surface 700 corresponding to the space between two picture elements, the optical waveguide layer 600 is formed by a film-forming of the material including a binder resin and a solvent by means of spin coating, blade-coating, etc. and finish-processing in dry solidification. A selective film-forming using ink-jet printing technology for flat surface 25 surrounded by the tilted reflective surface 700 can be used before the dry solidification.

In some embodiments, the binder resin that forms the optical waveguide layer 600 does not have to be self-polymerizing, but includes dry-solidified or polymerize-solidified after film coating. For this last material, higher durability and tighter contact than that for dry solidification. However, since polymerize-solidification uses UV light or X ray exposing or thermal heating, a process is selected that does not damage the organic layer. For the optical waveguide layer 600, one of resins or mixed with the plurality of them as transparent acrylic resin, benzocyclobutene resin, polyimide resin, epoxy resin, polyacryl amide resin, polyvinyl alcohol, etc. or photoresist is usable. In some embodiments, the height H2 of the optical waveguide layer 600 is less than the height H1 after solidification of the optical waveguide layer for the previous reason.

On the optical waveguide layer 600, a seal-off material 900 is set by the gap 950. In some embodiments, the seal-off material 900 includes a glass plate, plastic films which are enhanced for gas-barrier characteristics using inorganic layers or complex layered material using thin glass plates and plastic films. The seal-off material can keep a gap 950 against the optical waveguide layer 600 with using the bank 500 as a spacer and is fixed with the substrate 800 by an adhesive seal material formed around the peripheral of the display portion 2 in a form of a frame. For this fixing, a gap 950 is filled with inert gases such as nitrogen and the gases are not locked by cementing the seal-off material 900 to the substrate 800 in an air tight manner. In addition, desiccant is put between the seal-off material 900 and the substrate 800 as required without degrading the display capability.

Figure 11:
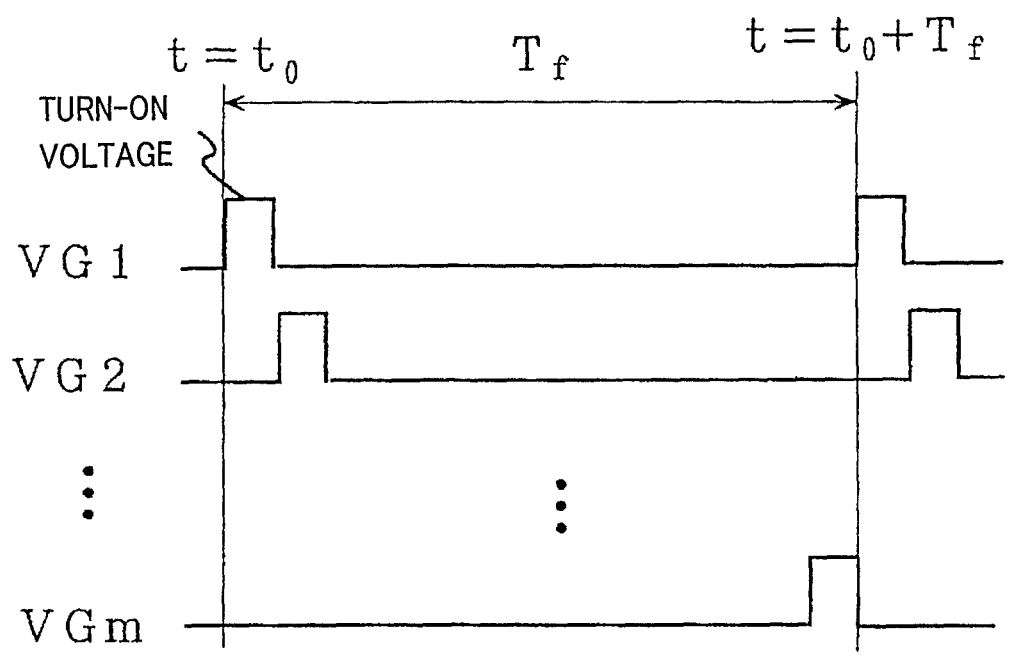
FIG. 11 is a timing chart of the applied voltage to the gate line.
Figure 12:
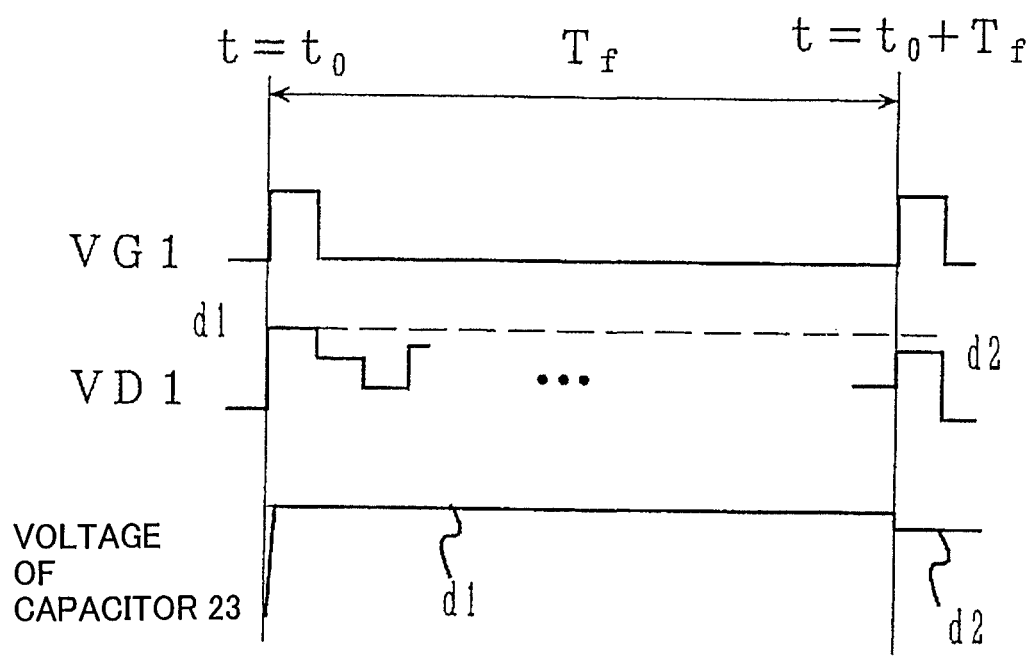
FIG. 12 is an explanatory schematic of an example of voltage status among the gate voltage, the data line voltage and the voltage in the storage capacitor.

Next, we explain the display operation of the display device 1 using FIG. 8, FIG. 11 and FIG. 12. FIG. 11 is a timing chart of the voltage VG1, VG2, . . . , VGm applied to the gate line G1, G2, . . . , Gm in order. FIG. 12 shows the voltage status of the gate voltage VG1, the data voltage VD1 and the voltage of the storage capacitor 23. As shown in FIG. 11, the VG1, VG2, . . . , VGm that turn-on the switching transistor 21 are applied to the gate line G1, G2, . . . , Gm in order. When the VG1, which turns on the switching transistor 21, is applied to the gate line G1 at the time $t=t_0$, the next turn-on voltage, after one vertical sweep of scanning with one frame term Tf, is applied to the gate line G1 at the time $t=t_0+Tf$. For this driving scheme, the time duration to apply the turn-on voltage to the one gate line is less than Tf/m. In some embodiments, the time duration of 1/60 second is used for Tf time value.

Once a turn-on voltage is applied to a gate line, all transistors, that are connected to the gate line transition into a turn-on status and synchronous data voltages responding to picture signals are applied to the data lines. This is called a progressive line scanning method. Focusing on the picture element located at the cross point of the first column and the first row, we explain the gate voltage VG1, the data voltage VD1 and the voltage status of the storage capacitor 23 with reference to FIG. 12. We assume the value d1 for the data voltage VD1, is synchronous to VG1, and the value d2 for the data voltage at the time of the next frame $t=t_0+Tf$. In this embodiment, these data voltages are stored in the storage capacitor 23, while the turn-on voltage is being applied to the gate line G1, and these voltages are maintained for one frame term. These voltages determine the gate voltage of the driver transistor 22 and the current though the transistor is controlled by the gate voltage. The voltage given by these and common voltage line, and the voltage Va applied to the transparent electrode determine a electric current which flows into the light-emitting element.

In other words, by synchronously turning-on the voltage applied to the gate lines corresponding to the picture elements of which light intensity should be controlled, it is possible to control the light emission of the picture element by applying the voltage corresponding to the image information through the data lines. Therefore, it is possible to present a predetermined image by controlling the light emission from the plural picture elements that form the display portion 2. Moreover, in some embodiments, the response time of starting light emission after applying the voltage between the cathode and anode of the light-emitting element is less than 1 μs, therefore it is possible to display the picture image which is a high-speed moving picture. Intense light emission is generally obtained for bright picture presentation by a large current that flows through the organic light emitting diode, but electric power consumption becomes large and the life time of the diode (for example, defined as the life at the half intensity as the initial one) becomes shorter as the current is increased.

As described above, an embodiment can use the light as the image light with good efficiency, even though the light is lost during propagation for the past conventional technology. Therefore, the display devices in some embodiments have more intensity of light, emission and the brighter picture presentation than those in conventional technologies. In some embodiments, the display device has a lower power consumption than conventional devices, due to less current flowing into the light-emitting element and longer life time. Moreover in the display device according to some embodiments, the optical waveguide layer is separated for each picture element, such that there is no picture degradation such as optical cross talk or blur of presentation from no light being guided to other picture elements, resulting in a display with clear images and high quality images.

Moreover, we have presented an embodiment where the light emitting area is on the flat plane of the substrate with no step differences due to the presence of the driving devices or wiring lines thereon, and where the step differences due to the driving devices and wiring lines are covered by the banks; however, the embodiments are not confined to such a configuration. For example, in some embodiments, on the substrate on which the driving devices and the wiring lines are formed, all of the display portion including the step differences due to the driving device and wiring lines are covered by a planarizing layer including of an insulating material, on which a flat surface of those constructing elements such as the reflective electrodes and banks or the like can be formed. In some embodiments, an organic planarizing layer material as acryl base resin, benzocyclobutene resin or polyimide base resin can be used. By the film forming method using spin-coating of these materials, the surface of these films can be flattened. By utilizing the surface on the wiring lines and driving devices after film formation by planarizing the layer such as the light emitting area, we can obtain an extensive light emitting area even though we have less flat area due to the large area used for wiring lines and driving devices we can realize a bright display device.

In the above embodiment, we have explained the active matrix drive scheme, however some embodiments are not limited to this specific embodiment. For example, we can apply the present embodiment to a passive matrix driving display device, where the electrodes are directly connected to the vertical scanning lines and horizontal scanning lines. Moreover, the arrangement of picture elements can be either a stripe arrangement, a mosaic arrangement or a delta arrangement, and we can select an appropriate arrangement to be compliant to the specifications of the display devices.

Figure 13A:
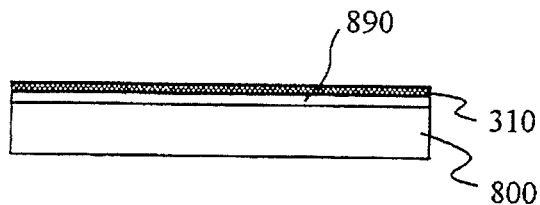
FIGS. 13A-13D schematically show the process to fabricate the bank of the display device.
Figure 13B:
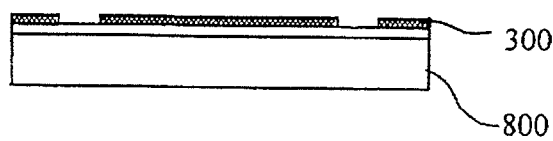
Figure 13C:
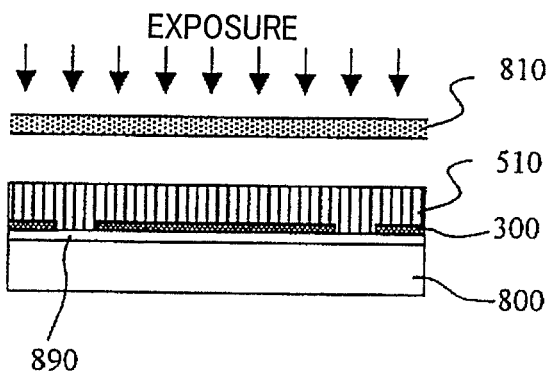

Next, we explain the manufacturing method of the first embodiment referring to FIGS. 13A-13D to FIGS. 16A-16C. FIGS. 13A-13D show a process to manufacture the banks in this manufacturing method of the display device. As shown in FIG. 13A, driving devices (such as thin film transistors, hereinafter) and wiring lines are formed on the substrate 800; and on top of the substrate an insulating layer 890 is formed; and electrode layer 310, to be used for the reflective electrode 300 includes aluminum, magnesium, magnesium-silver alloy, or aluminum-lithium alloy is formed. It should be noted that thin film transistors and wiring lines are omitted in the drawings. The electrode 310 for the reflective electrode 300 is electrically connected to the thin film transistors for drivers. Next, we coat the photoresist on the electrode layer 310 for the reflective electrode 300 and make patterns of photoresist by photo-lithography. We etch the electrode layer 310 by using patterns of photoresist and obtain the island-shaped reflective electrode 300 corresponding to the picture element, as shown in FIG. 13B after removing unnecessary photoresist.

Figure 13D:
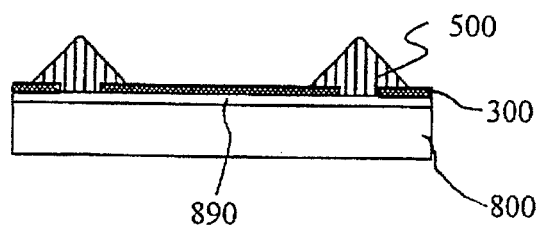

Next, we coat a photoresist to a predetermined thickness by spin-coating the photoresist on the substrate 800 and on the reflective electrode 300. The thickness of the photoresist can be controlled by the viscosity by adjusting the density of the resist since it is solved in a solvent and further controlled by the spinning rotation speed of the substrate in the film forming process. After coating the photoresist, photoresist film 510 is formed by heating and evaporating the solvent. The photoresist film 510 is exposed to light through photo masks 810 (FIG. 13C), and is developed into the shape of banks 500, located between the picture elements (as shown in FIG. 13D). There are two kinds of photoresists; a negative one and positive one. In some embodiments, since the un-exposed portion is solved in the development for the negative type resist, the cross sectional shape of the photoresist tends to be rectangular or close to trapezoid. For the positive type resist, the cross sectional shape of the resist after development is such that the side surface of the resist is decreasing in accordance with the location of the side surface apart from the surface of the substrate. The selection of positive or negative resist considers the desired shapes of banks 500 the shapes closer to the desired ones are obtained.

In some embodiments, the negative type resist, includes a cinnamic acid base resist or rubber base resist as cyclized rubber added with bisazide compound for photosensitive radical. In some embodiments, the positive type resist includes a mixed material of naphtoquinonediazido compound for photosensitive agent and alkali-soluble phenolic resin. An example of the positive type resist, there is a commercial product call "OPTOMER PC" (manufactured by JSR Corporation). This resist is a mixture of acryl base resin and naphtoquinonediazido compound. In some embodiments, the viscosity is, for example for the use of "OPTOMER PC403", controlled for a 3.5 μm thick film formation when coated at a spinning speed of 700 rpm.

Figure 14:
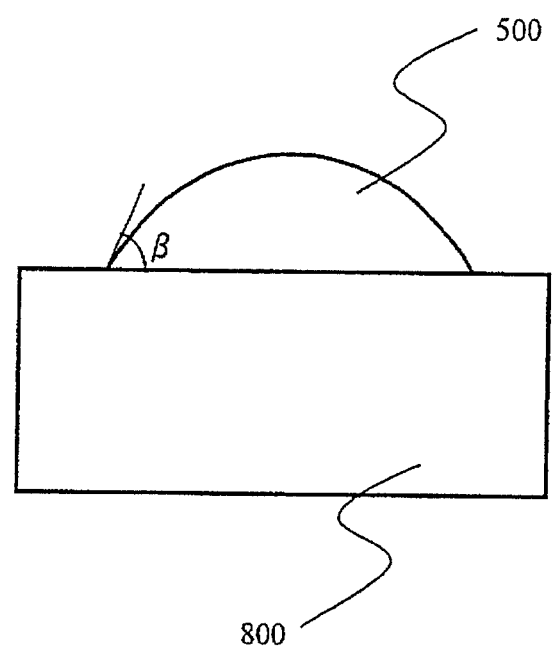
FIG. 14 is a schematic view of the bank of the display device.

For this embodiment, we coat the photoresist on the substrate, dry by thermal heat and photo-expose by using a photo mask so that the areas of the banks are exposed. By these processes (as exposure, development and heating), we obtain the bank 500 in a cross sectional shape as shown in FIG. 14. The tilt angle β of the side surfaces of the bank closest to the substrate surface ranges from 30° to 60° depending upon the process condition, and continuously decreases according to being apart from the substrate surface. For example, we obtain an angle β of about 60° and the tilt angle is 20° for a height of 3 μm for the bank that has a 3.5 μm height. This bank can be used for this embodiment. In some embodiments, we use photosensitive polyimide as a positive type photoresist product of which code is HD8010XF2 (Hitachi Chemical Co. Ltd.).

As for the photo mask 810, in some embodiments, we use ultra-violet light-transmissive fused silica substrate on which shadow pattern is formed by the metal film. In some embodiments, we use a photo mask that has light control capability by controlling the thickness of the shadow metal or the area of the plural small open hole at the location of the shadow masks that are effective to the transparency change in a continuous, manner. In some embodiments, we discussed the process to use photoresist for making the banks because we can manufacture the banks of several micron meters height in a shorter processing time.

However, in some embodiments, we use an inorganic material such as silicon oxide or silicon nitride for the use of banks. For the embodiment of using silicon nitride, we can form the bank by the silicon nitride layer formed by CVD (Chemical Vapor Deposition) on the substrate, and pattern by etching through the resist pattern and removing the unnecessary photoresist thereon. By varying the density conditions of the NH3 and SiH4 supplied for the film forming process, we can control the shape of the tilted surface of the bank after etching due to multiple layers of silicon nitride with different film properties. Any forming method, for example a screen printing method or direct drawing of the ink-jet, is used to form the bank 500 as long as the required tiled surfaces are obtained.

Figure 15A:
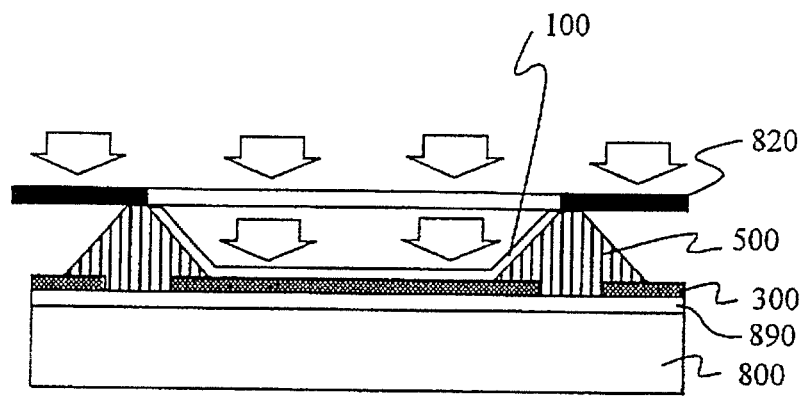
FIGS. 15A-15C schematically show the process to fabricate the organic layer of the device.
Figure 15B:
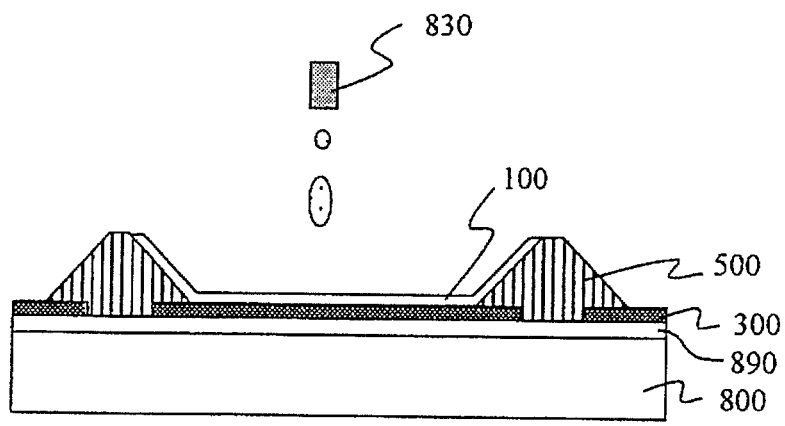
Figure 15C:
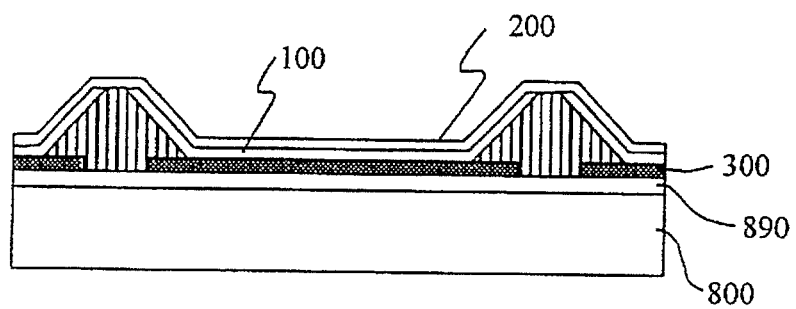

FIGS. 15A-15C show the process to manufacture the organic layer portion of the display device according to an embodiment. We make the bank 500 in the previously described process, and then we form the organic layer 100 on part of the tilted surface of the bank 500 and on the reflective electrode 300 in the area surrounded by the bank 500. As shown in FIG. 15A, the forming of the organic layer 100 is performed by depositing the organic material via a metal mask which has open areas corresponding to the locations of the light emitting areas. For this embodiment, the bank can be used as a spacer to suspend the mask. For the embodiment when the organic layer is a polymer type, the film forming is performed by blowing the solution of solvent and the organic material from the ink-jet head 830 using the control method with a piezo device, as so-called ink-jet patterning technology as shown in FIG. 15B. For this method, the banks 500 can function as dams to store the ink-droplet.

After forming the organic layer, the transparent electrode 200 is formed on all of the display portions. In some embodiments, the transparent electrode includes electrically conductive transparent film such as ITO or IZO, and is formed by vacuum evaporation or sputtering process (see FIG. 15C). However, it is difficult to form low resistive transparent film by using the conventional deposition method and damage to the organic layer 100 result in the degradation of the characteristics of the embodiment described using sputtering method. Therefore, an ion plating device or a counter target sputtering device, where plasma does not directly contact the surface of the substrate, is better to be used in forming the transparent electrode 200 in order to minimize damage. We can form a thin metal deposition film through which the light transmits directly onto the organic layer before forming the transparent conductive film. We may exploit the transparent conductive film deposited on this thin metal deposition film for the transparent electrode. For this embodiment, the thin metal deposition film functions as a blocking layer, such that it is possible to reduce the damage of the organic layer. In some embodiments, the blocking layer, includes a metal such as gold, platinum or chrome that has a high work function and a thickness of about 10 nm.

Figure 16A:
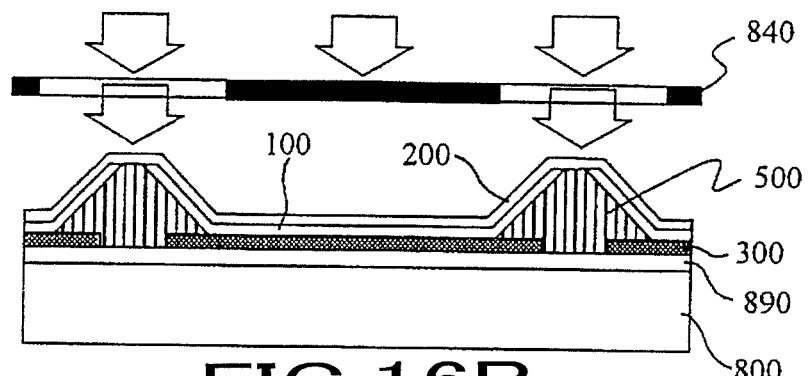
FIGS. 16A-16C schematically show the process to fabricate the optical waveguide layer of the device.
Figure 16B:
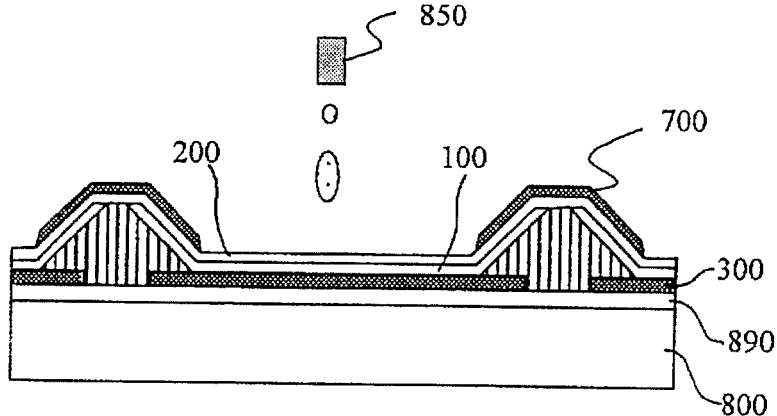
Figure 16C:
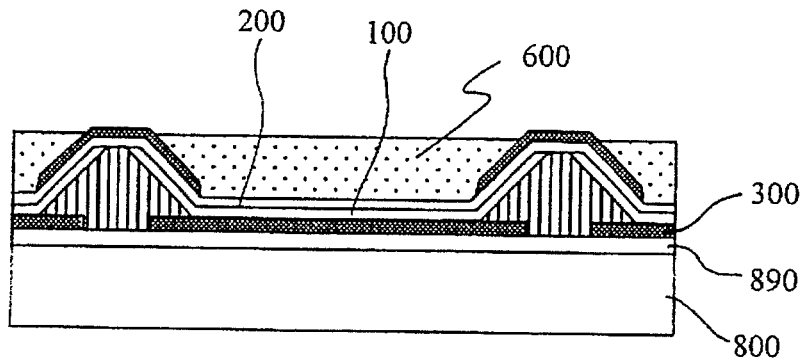

FIGS. 16A-16C show the process to manufacture the optical waveguide layer of the display device according to an embodiment. As shown in FIG. 16A, we form the tilted reflective surface 700 by selectively depositing a high reflective metal such as aluminum using a metal mask that has open holes corresponding to the banks 500 made in the process described above. Afterwards, we blow the compound material for the optical waveguide layer to the basin area surrounded by the bank 500 through the ink-jet head 850 as shown in FIG. 16B. The compound material includes solvent and the binder resin is transparent for visible light. We form the optical waveguide layer 600 which is slightly lower than the top end of the tilted reflective surface as shown in FIG. 16C in such a way that the compound material of the optical waveguide layer is stacked up to the height of the bank or slightly lower than that of the bank, is kept for a mean time enough to get wet with the transparent electrode 200 and the tilted reflective surface 700 and to obtain leveling and then dry and solidify. We may form the predetermined optical waveguide layer by repeatedly blowing the compound material for the optical waveguide layer, dry and solidify.

For the binder resin of the optical waveguide layer 600, in some embodiments, the binder resin has no polymerization property, but is merely dried for solidification and another binder resin that is solidified by a polymerizing process after film formation. The resin that can be solidified by polymerizing process has tighter contact and higher durability than the simple dry and hardening process, however, the exposing to ultraviolet light or electron beam or heating are varied in order to obtain the least damage to the organic layer.

We can use a resin or a complex mixture of resins from acrylic resin, benzocyclobutene resin, polyimide resin, epoxy resin, polyacryl amide resin, polyvinyl alcohol, etc. By using such material for the optical waveguide layer 600, it is possible to make an optical waveguide layer that has smaller refractive index than such transparent electrodes as ITO and IZO and larger one than the air.

As for forming the optical waveguide layer, the film forming of the optical waveguide layer compound material is performed by coating the substrate using a spin-coater drying for hardening besides selectively depositing the compound in the area of the basin surrounded by the banks by using ink-jet. In this embodiment, the substrate is exposed to O2 plasma and then CF4 plasma after forming the tilted reflective surface, but before forming the layer of the optical waveguide layer compound material. In this embodiment, the tilted reflective surface made of aluminum which is only fluorinated has liquid-repellency, and the transparent electrode which is not fluorinated, maintains wettable surface characteristics to the optical waveguide layer compound material. Therefore, the optical waveguide layer compound material stays on the area to which the transparent electrode surface is exposed, and not on the tilted reflective surface. This results in the optical waveguide layers isolated by the tilted reflective surface for each of the picture element.

In some embodiments, it is desirable that the optical waveguide layer is completely isolated by the tilted reflective surface, however, each of the isolated waveguide layer it connects to that on the adjacent picture element beyond the tilted reflective surface. For this embodiment, in the area where the optical waveguide layer is thinnest, mostly at the ridgeline of the bank, the thickness of the optical waveguide layer is less than the visible light wavelength and waveguide modes are so limited that only a little amount of light leaks to the next picture element. Therefore, even though the optical waveguide layer has continuity to adjacent picture elements, the optical waveguide layer is practically isolated provided the thinnest optical waveguide layer is less than the visible light wave length. Therefore this embodiment does not necessarily exclude such continuity of the optical waveguide layer.

As shown in FIG. 1, the seal-off material is fixed with the substrate 800 by adhesive sealing cement formed in a frame shape around the peripheral area of the display portion by keeping the gap 950 between the seal-off material 900 and the optical waveguide layer 600 with the bank 500 as a spacer. The gap 950 has an equivalent refractive index of air by filling the inert gas as nitrogen with the gap 950 between the seal-off material 900 and the substrate 800. As for the seal-off material 900, we can use a transparent (for visible light), gas-barrier capable plates such as a glass plate, a plastic film processed for gas barrier, a multi-layer with glass plates and the plastic films.

The Second Embodiment

Figure 17:
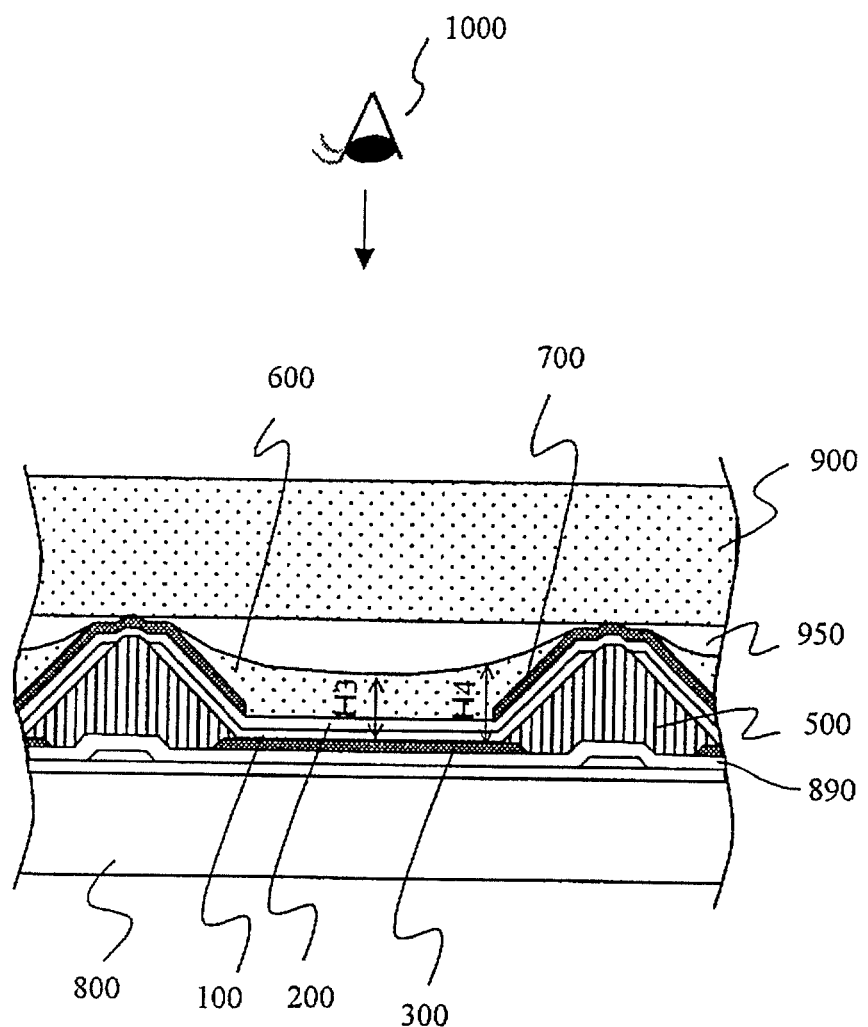
FIG. 17 is a cross sectional view of a picture element of the second embodiment of the display device.

Next, we will explain another embodiment of the display device. FIG. 17 shows a cross sectional view of another embodiment of the display device. In this display device, the height H3 of the optical waveguide layer located at the central area of the basin area surrounded by the bank 500 is continuously larger as being closer to the bank 500. Besides the height H4 of the optical waveguide layer 600 on the tilted reflective surface 700 is larger than H3, we will use the same signs and notations for the same portions and omit the detailed explanation.

For the optical waveguide layer 600 which satisfies the relation of these heights, we can form it by controlling the dry out speed of the coated optical waveguide layer compound material when we coat the optical waveguide layer compound formed of binder resin and solvent with taking the boiling point and the vapor pressure of the solvent in the room temperature into account. In other words, we can obtain the optical waveguide layer in a form that the height is low in the central area surrounded by the bank and is high on the tilted reflective surface 700, in accordance with the volume shrinkage after coating the optical waveguide layer compound, leveling the coated film and drying for solvent evaporation. In this embodiment, the surface of the optical waveguide layer 600 is not parallel, but declines to the surface of the substrate.

Figure 18:
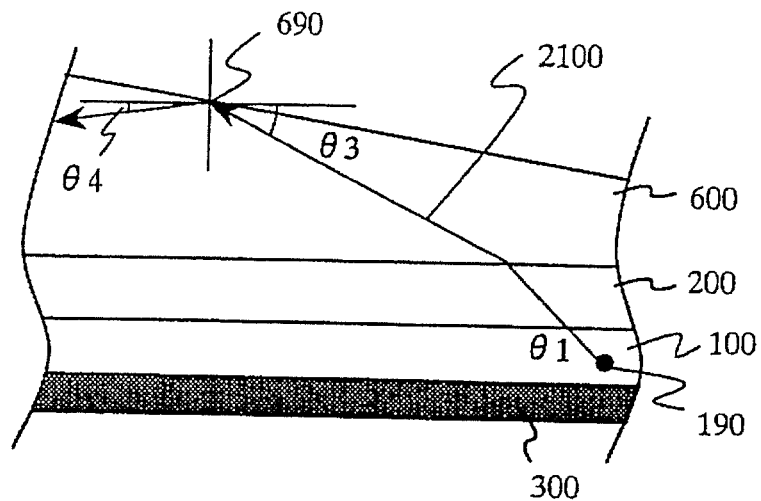
FIG. 18 is a schematic view of the effect of the optical waveguide layer in the second embodiment.
Figure 19:
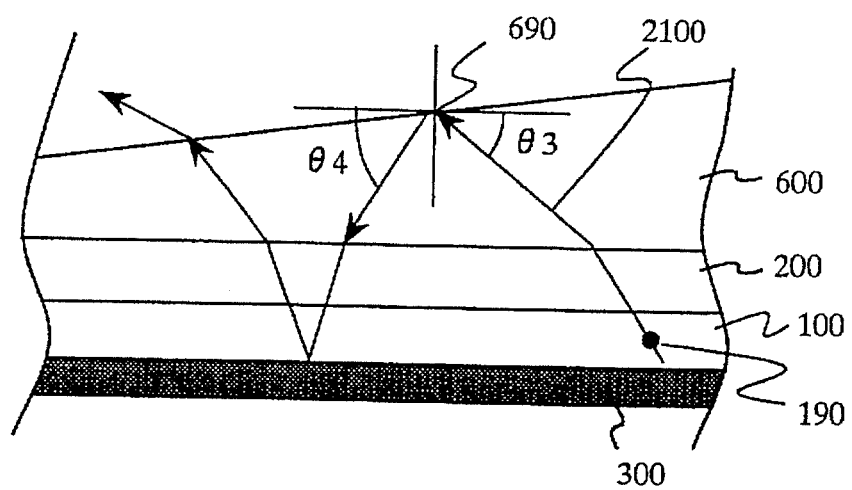
FIG. 19 is another schematic view explaining the effect of the optical waveguide layer in the second embodiment.

Next, we will explain the effect of the optical waveguide layer 600 described above. FIG. 18 and FIG. 19 show embodiments where the optical waveguide layer 600 has a different height for each location, that is, the surface of the optical waveguide layer 600 is not parallel to the substrate. FIG. 18 shows the embodiment where the height of the optical waveguide layer on the upper location of the light 2100 which is emitting the light at location 190 is lower than the height of the layer at the location 690 where the light 2100 reflects on the surface of the optical waveguide layer. We assume the incident angle and reflection angle of the light 2100 at the surface of the optical waveguide layer against the surface parallel to the substrate as θ3 and θ4, respectively. Then the relation θ3>θ4 is satisfied, the light reflected on the surface of the optical waveguide layer is more parallel to the substrate. Therefore, the times of reflecting on the reflective electrode 300 until the light traveling until reaching to the tilted reflective surface in the optical waveguide layer decrease, and the light loss by absorbing the light at the reflective electrode, results in improving the external coupling efficiency.

On the other hand, FIG. 19 shows the case where the height of the optical waveguide layer on the upper location of the light 2100 which is emitting the light at location 190 is higher than the height of the layer at the location 690, where the light 2100 reflects on the surface of the optical waveguide layer. We assume the incident angle and reflection angle of the light 2100 which is totally reflected at the surface of the optical waveguide layer against the surface parallel to the substrate as 83 and 84, respectively. Then the relation θ3<θ4 is satisfied, the light reflected on the surface of the optical waveguide layer is more vertical to the substrate. Therefore, the totally reflected light on the optical waveguide layer surface at the first time has the smaller incident angle when the light again incidents the surface of the optical waveguide layer. If the incident angle is smaller than the critical angle, then the light comes out to an outer viewer before the light comes up to the tilted reflective surface. Therefore when the outer surface of the optical waveguide layer tilts to the substrate, higher external coupling efficiency is obtained than in the case where the optical waveguide layer is parallel to the substrate.

The Third Embodiment

Figure 20:
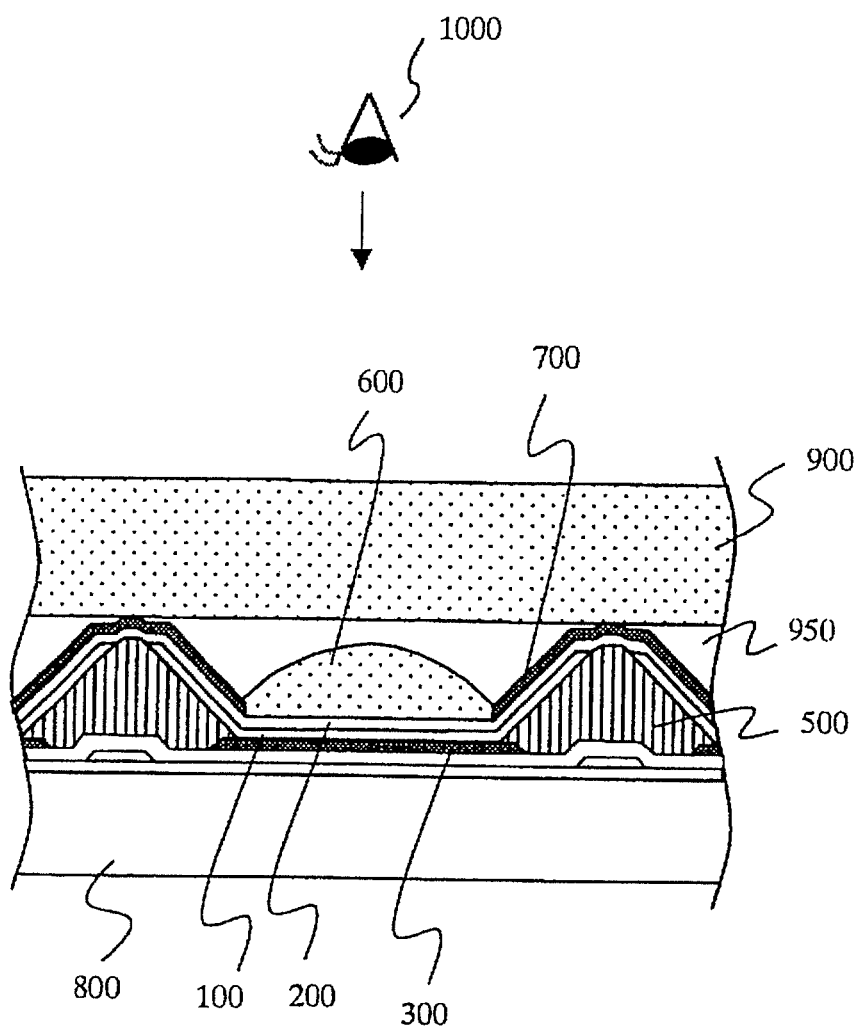
FIG. 20 is a cross sectional view of a picture element of the third embodiment of the display device.

Next, we will further explain another embodiment of the display device. FIG. 20 shows a cross sectional view of a picture element in another embodiment. For this embodiment of the display device, the thickness of the optical waveguide layer has the maximum at the center of the area surrounded by the bank 500 and is continuously decreases the closer to the bank. Since the fundamental construction is same as the embodiment described above other than the shape of the optical waveguide layer being convex, we mark with the same signs and notations to the same portions and avoid the explanation. This shape of the optical waveguide layer is made by making the tilted reflective surface 700 liquid-repellent and the transparent electrode 200 exposed to the optical waveguide layer liquid-wettable before coating the optical waveguide layer compound material formed of binder resin and solvent. As a concrete process, the substrate is exposed to oxygen plasma and CF4 plasma in order before coating the optical waveguide layer compound material.

In this embodiment, if the tilted reflective surface is made of aluminum then the surface is fluorinated and has liquid (water)-repellent characteristics, however the transparent electrode is not fluorinated and keeps wettable surface characteristics against the optical waveguide layer compound material. Instead of these processes, we can make the tilted reflective surface liquid-repellent and the transparent electrode exposed to the optical waveguide layer selectively liquid-wettable by coating all over the substrate with a transparent wettability-converted layer which is not shown in the figures. The wettability-converted layer can be formed by coating a solution in which the binder resin, the photocatalyst and the necessary additives are dispersed, drying and fixing the photocatalyst in the hardened resin. If the thickness of the wettability-converted layer is large, then it allows guiding the light and causes the optical cross-talk by light leak to other picture elements. Therefore, in some embodiments, the particle size of the photocatalyst should be less than 10 nm and the layer being less than 300 nm. In some embodiments, we use titanium oxide for the photocatalyst and organosiloxane polymer for the binder resin. After forming the wettability-converted layer and photo-exposing with the tilted reflective surface blocked off from the exposure, and the transparent electrode exposing to the optical waveguide layer through the photo mask, the exposed wettability-converted layer changes to be high liquid-wettability and the non-exposed one maintains to be liquid-repellent.

After making the tilted reflective surface 700 liquid-repellent and the transparent electrode 200 exposed to the optical waveguide layer liquid-wettability, the coated optical waveguide layer compound material turns into a convex shaped optical waveguide layer such that the thickness of the optical waveguide layer is the maximum at the center of the area surrounded by the bank and continuously decreases towards the bank 500. For this construction, improvement of the external coupling efficiency can be expected due to the slope of the optical waveguide layer 600 against the substrate surface.

The Fourth Embodiment

Figure 21:
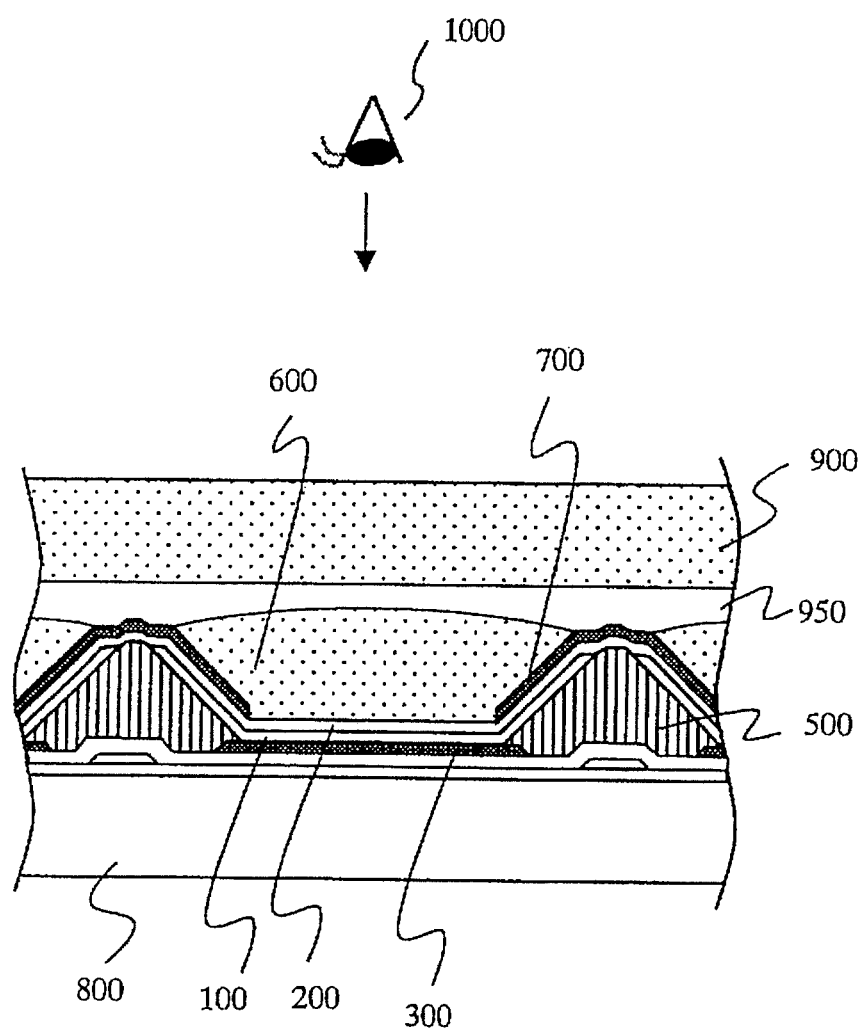
FIG. 21 is a cross sectional view of a picture element of the fourth embodiment of the display device.

Next, we further explain another embodiment of the display device. FIG. 21 shows the cross sectional view of a picture element that explains another embodiment. This embodiment has an increased optical waveguide layer and the maximum height of the layer is higher than the height of the bank; therefore, the fundamental construction is same as the embodiment described above. From this reason, we use the same signs and notations for the same portions and omit detailed explanations. In this embodiment, it is possible to make the ridgeline of the bank liquid-repellent and the other parts including the tilted reflective surfaces selectively high liquid-wettable by blocking the light exposure onto the ridgeline of the bank when the light is exposed to the wettability-converted layer. In this embodiment, improvement of the external coupling efficiency can be expected due to the slope of the optical waveguide layer 600 against the substrate surface. In addition, a display device that has high intensity of the light emission normal to the front surface is realized due to the focusing effect of the optical waveguide layer as the convex surface shape of the optical waveguide layer. However, in some embodiments, the bank 500 is not used as a spacer between the substrate 800 and seal-off material when they are tightly cemented. Therefore, in some embodiments, we use an adhesive seal material including beads or small rods pasted at the peripheral area of the display portion in a shape of a frame to such area and then the substrate 800 and the seal-off material 900 are fixed in nitrogen gas filled therebetween.

The Fifth Embodiment

Figure 22:
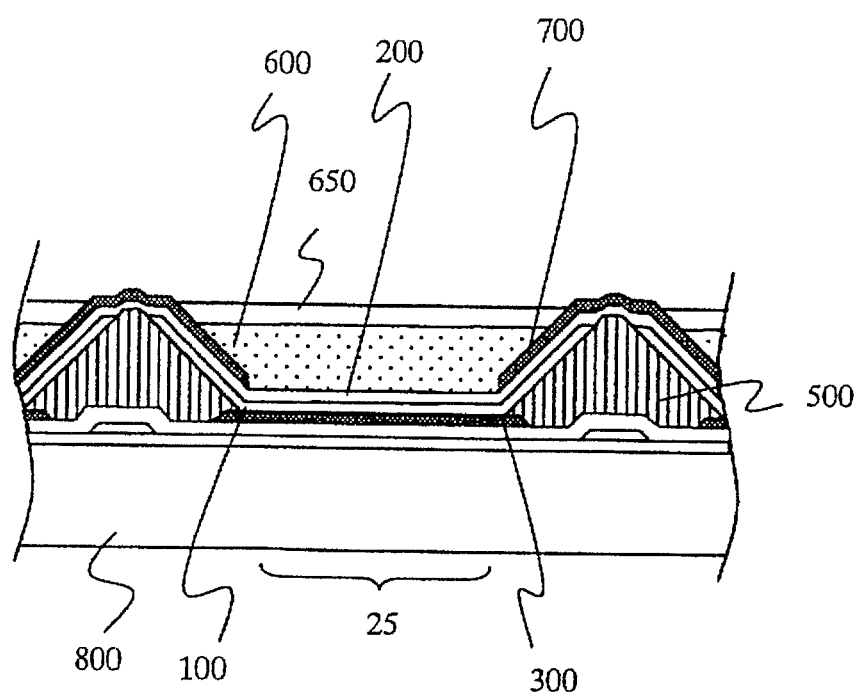
FIG. 22 is a cross sectional view of a picture element of the fifth embodiment of the display device.

Next, we explain another embodiment of the display device. FIG. 22 shows a cross sectional view of the picture element of the display device. This embodiment is a modification of the embodiment explained in FIG. 1 such that the seal-off material 900 is replaced by an optical waveguide layer 650 (called a gas-barriering optical waveguide layer, hereinafter) that is transparent and high density and has a high gas-barrier characteristic and that is further formed on the optical waveguide layer 600. Since the other constructions are the same as the above embodiment, we use the same signs and notations for the same portions and omit detailed explanations. For the gas-barriering optical waveguide layer, we can use silicon nitride, titanium oxide and we optimize the condition such as the gas flow rate when using chemical vapor deposition method by which we form a dense film. We form a multi-layered gas-barrier layer instead of a single layer, and moreover we optically isolate the layer on each of the picture elements by using photo-lithography technology (when needed). Being same as the above embodiment, the external coupling efficiency is improved and the display device that presents a distinct picture quality and has no optical cross talk, is realized. Especially, there is a merit that a thin and light display device is realized since no seal-off material is used.

The Sixth Embodiment

Figure 23:
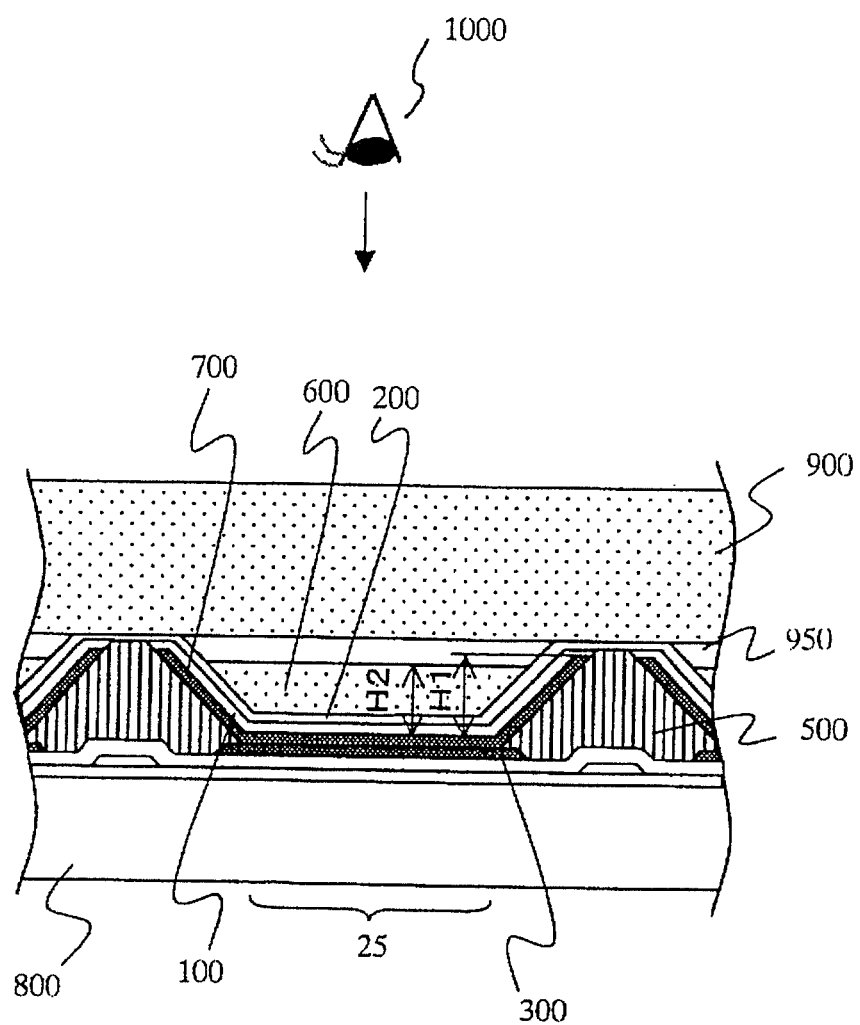
FIG. 23 is a cross sectional view of a picture element of the sixth embodiment of the display device.

Next, we explain another embodiment of the display device. FIG. 23 shows a cross sectional view of the picture element of the display device. This embodiment modifies the embodiment explained in FIG. 1 such that a tilted reflective surface 700, which has a reflective electrode, is formed on the reflective electrode 300 and the slope surface of the bank 500 before forming the organic layer 100 and the organic layer 100, transparent electrode 200 and the optical waveguide layer 600 are formed thereon. Since the other constructions are same as the above embodiment, we use the same signs and notations for the same portions and omit detailed explanations. We explain the fabrication process of the embodiment shown in FIG. 23 in referring to FIGS. 24A-24C, FIGS. 25A-25C and the drawing of the previous embodiment. FIGS. 24A-24C and FIGS. 25A-25C are process drawings that explain the manufacturing method of another embodiment shown FIG. 23.

Figure 24A:
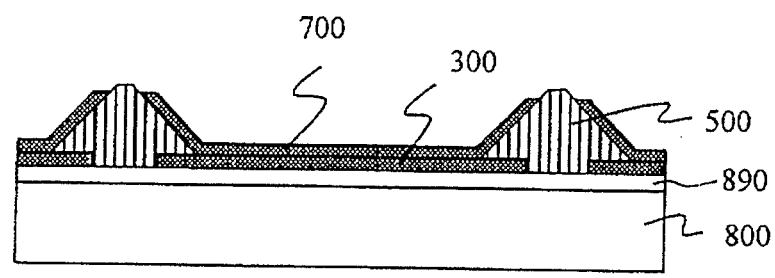
FIGS. 24A-24C schematically show the fabrication process of the display device regarding the sixth embodiment shown in FIG. 23.

The process for this embodiment is same as the previous embodiment up to the step where driver elements and wiring lines are formed, and the island-shaped reflective electrode 300 including aluminum, magnesium, magnesium-silver alloy or aluminum-lithium alloy and banks 500, that correspond to the picture element, are constructed on a substrate 800 with an insulating layer 890 on the upper surface. In the next step, we form a layer of a reflective metal material similar to the reflective electrode 300 over all surfaces of the display portion, and then we construct the island-shaped tilted reflective surface 700, that corresponds to the picture element, on the reflective electrode 300 and the slope surface of the bank 500 by applying photolithography technology and etching as shown in FIG. 24A. Therefore, the tilted reflective surface 700 and the reflective electrode 300 are electrically connected and then the tilted reflective surface 700 functions as a reflective electrode.

Figure 24B:
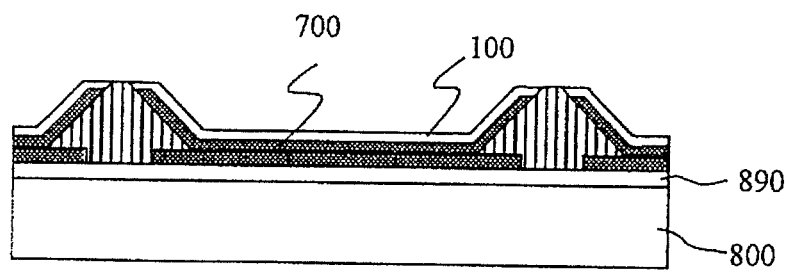

In the next step, similar to the above embodiment explained by using FIGS. 15A-15C, the organic layer 100 is formed by selective deposition through masks or selective ink-jet patterning. In this embodiment, the organic layer 100 is formed in an extensive area so that it completely covers the edges of the tilted reflective surface 700 (as shown in FIG. 24B). Because a failure is caused by the electrical short between the tilted reflective surface and the transparent electrode 200 formed on the organic layer 100 if the edge of the tilted reflective surface is unconcealed.

Figure 24C:
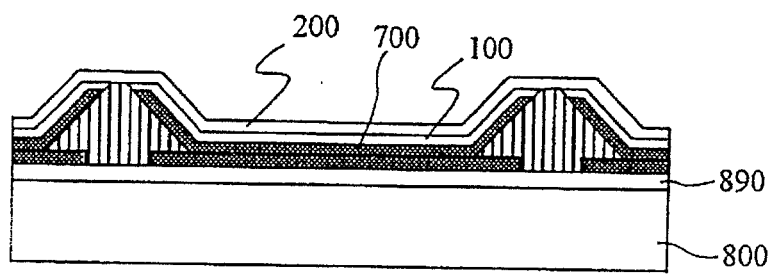

In the next step, the transparent electrode 200 is formed all over the display portion as shown in FIG. 24C. In some embodiments, we use ITO or IZO for the transparent electrode as described in the above embodiment and we form it in the same method used for such embodiment. As further shown in FIG. 25A, we coat the wettability-converted layer over the display portion. The wettability-converted layer is the layer for which we can change the wettability of a selectively predetermined area as liquid-repellant to liquid-wettable or vis-a-vis. We can use a film consisting of a photocatalyst and a binder resin. For this embodiment, the wettability-converted layer can be formed by coating a solution in which the binder resin, the photocatalyst and the necessary additives are dispersed on solvent, drying and fixing the photocatalyst in the hardened resin. If the thickness of the wettability-converted layer is large, then it allows guiding the light and causes the optical cross-talk by light leakage to other picture elements. Therefore, in some embodiments, the particle size of the photocatalyst should be less than 10 nm and the layer is less than 300 nm. In some embodiments, we can exploit titanium oxide for the photocatalyst and organosiloxane polymer for the binder resin. After forming the wettability-converted layer and photo-exposing through a photo mask 870, the exposed wettability-converted layer turns to be high liquid-wettability and the non-exposed one maintains to be liquid-repellent.

Figure 25A:
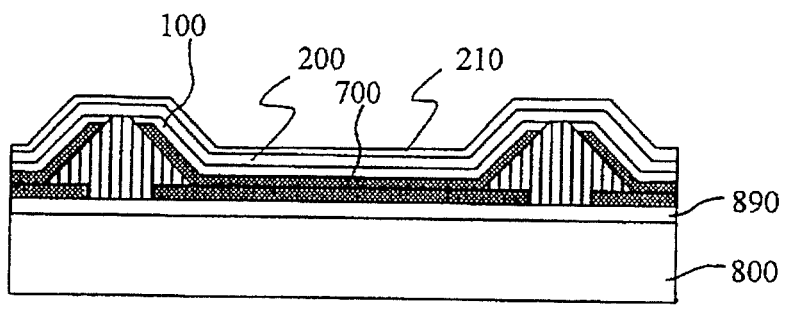
FIGS. 25A-25C schematically show the fabrication process of the display device regarding the sixth embodiment shown in FIG. 23.
Figure 25B:
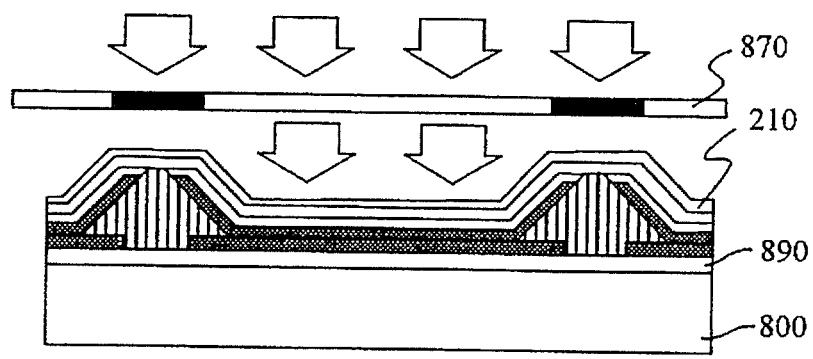
Figure 25C:
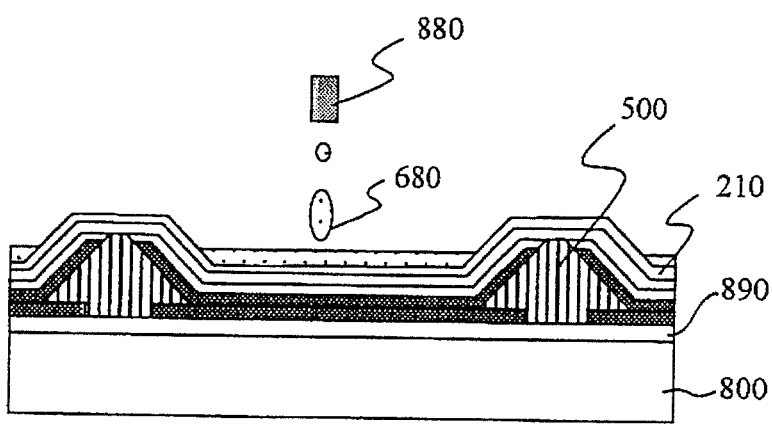

Therefore, the ridgeline of the bank 500 corresponding to the isolation gap between the picture elements maintain liquid-repellency, and the other portion changes to be highly liquid-wettable after light-exposing to the wettability-converted layer through a photo mask 870 which blocks the light for the ridgeline of the bank 500 corresponding to such an isolation gap and lets the light transmitting to other portions (as shown in FIG. 25B). In the next step, the optical waveguide layer compound material 680 is blown onto the basin area surrounded by the bank 500 from the ink-jet head 880 as shown in FIG. 25C. For at least the same reasons explained in reference to the embodiment of FIG. 16, the optical waveguide layer compound material at least includes solvent and binder resin which is transparent to the visible light. The optical waveguide layer compound material is stacked up to the level similar to the height of the tilted reflective surface 700. In this embodiment, the blown optical waveguide layer does not stay on the ridgeline of the bank 500 and moves to a puddle in the basin area surrounded by the bank 500. After we keep the blown optical waveguide layer compound material to obtain enough leveling, we then form the optical waveguide layer 600 which is optically isolated on each picture element by making the level lower than the upper edge of the tilted reflective surface 700 after dry and solidification. In addition, we can form the construction of the optical waveguide layer not only by a single process of blowing the optical waveguide layer compound material, drying and solidifying, but by repeating such process.

As the next step, we fix the seal-off material 900 with the substrate 800 by an adhesive seal material formed around the peripheral of the display portion in a form of a frame in a status that a gap 950 between seal-off material 900 and the optical waveguide layer 600 is kept by the bank 500 as a spacer. The gap 950 has an equivalent refractive index of by filling the inert gas as nitrogen between the seal-off material 900 and the substrate 800. In this embodiment and the above embodiments, being different from the conventional technology where the light propagates in parallel to the substrate, and then is attenuated, the light is guided by the optical waveguide layer 600 to the tilted reflective surface 700, and then changes direction of propagation by the reflection at the tilted reflective surface 700, and is used as an effective display image light to the viewer resulting in the improvement of the external coupling efficiency. Since the optical waveguide layer 600 is completely isolated, the light emitted from an organic layer of a certain picture element does not propagate in other different picture elements and no picture quality problem such as optical cross-talk or blur of presentation occurs, thus resulting in a display device that has a high quality picture image. Moreover, in this embodiment, the tilted reflective surface 700 does not only function as a reflection surface, but also as a reflective electrode of OLED including the reflection electrode, the organic layer 100 and transparent electrode 200. Therefore, the slope surface of bank 500 is used for the emission area as well as the flat surface 25, therefore, when the relatively extensive emission area in comparison to the embodiment shown in FIG. 1 is used, a brighter display device is obtained on the basis of the same size of picture element.

Figure 26:
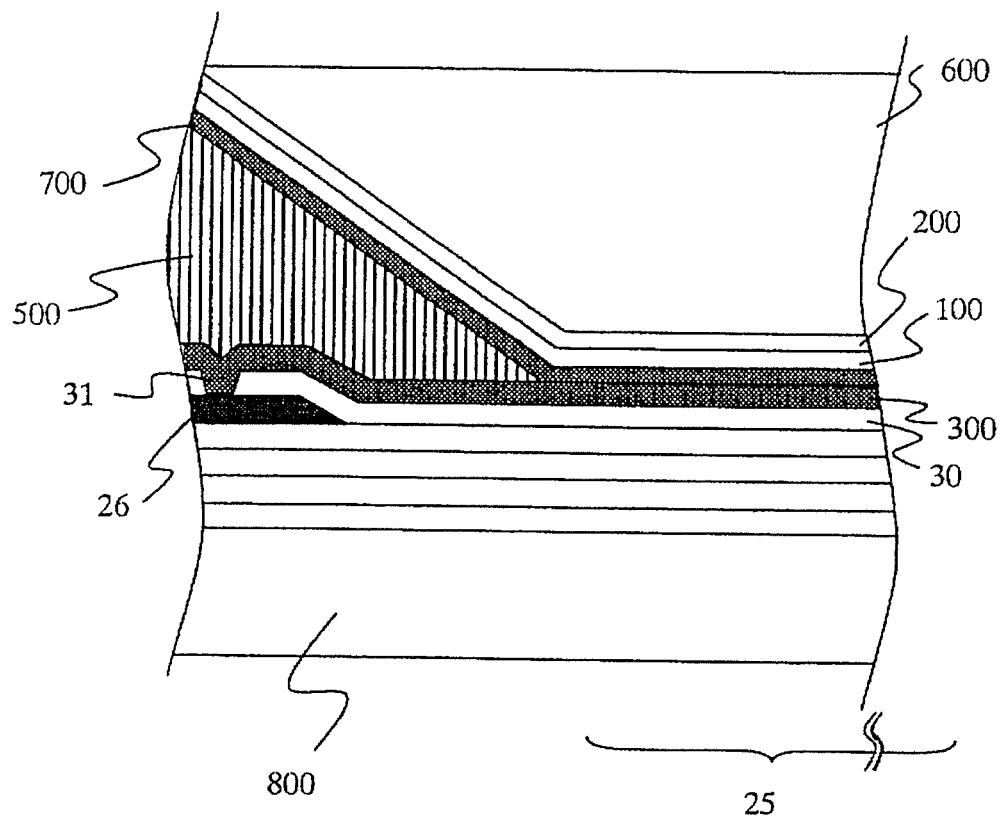
FIG. 26 is a cross sectional view of the picture element of the six embodiment of the display device.

FIG. 26 shows a cross-sectional view of the display device of an embodiment. The reflective electrode 300 electrically connects with the driver element on the area covered by the bank 500 similar to the above embodiment. In other words, the electrode 26 of the driver transistor and the reflective electrode 300 are connected through the contact hole 31 in the insulation layer 30. The contact hole 31 is located underneath the bank 500 and the tilted reflective surface 700. Thus, the contact hole area which is not used as a light emitting one is located under the tilted reflective surface, and the other area that emits the light is the light emitting area. This construction is efficient for realizing highly intense light emission.

The Seventh Embodiment

Figure 27:
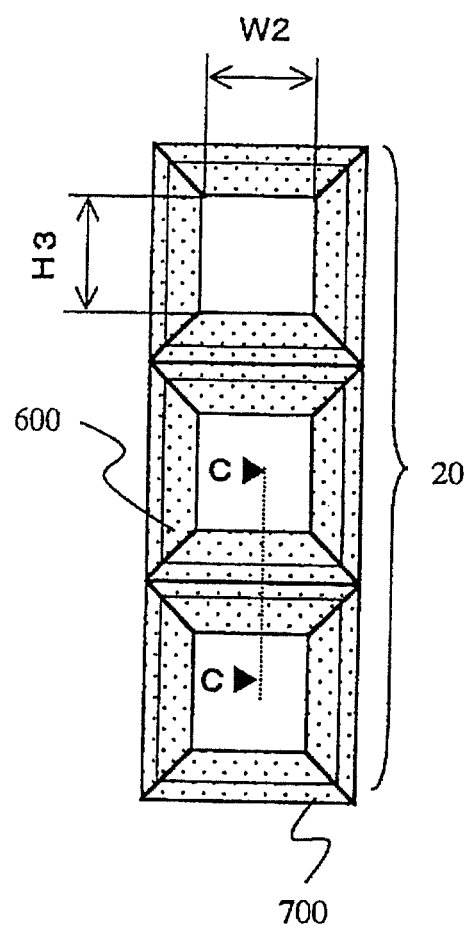
FIG. 27 is a plan view of a picture element of the seventh embodiment of the display device.

Next, we explain another embodiment. FIG. 27 shows a planar view of the display device of an embodiment. A unit picture element is shown as one of additive primary colors given by a red-color emission pixel, a green-color emission one and blue-color emission one therein. The pixel in this embodiment is constructed as picture element 20 of the display device explained in FIG. 1, and FIG. 2 is separated by the tilted reflective surface 700 and the bank 500 into a plurality of areas for each of such pixel. Since the other constructions are the same as above embodiment, we use the same signs and notations for the same portions and omit detailed explanations.

In the display device for this embodiment, a picture element is separated into a plurality of light emitting areas and we can control the viewing angle characteristics of the device by changing the relation between the size of the area and the height of the optical waveguide layer 600. This is, as described above, from the fact that the height of the tilted reflective surface and the thickness of the optical waveguide layer 600 (against the size of the light emitting area) influence the external coupling efficiency. In other words, the longer the width of the light emitting area against a certain height of the tilted reflective surface and a certain thickness of the optical waveguide layer is formed, then the smaller the external coupling efficiency; and conversely the shorter the width of the light emitting area, the larger the external coupling efficiency and the wider viewing angle are obtained. For the above embodiment explained in referring to FIG. 2, the viewing angle for the horizontal orientation is larger than that of the vertical orientation against the drawing plane. On the other hand, the display device that has the same viewing angle characteristics for vertical orientation and horizontal orientation is realized by segregating the light emitting area of a picture element into a plurality of light emitting areas, and making the length H3 in the vertical orientation the same as the length W2 in the horizontal orientation. In some embodiments, the external coupling efficiency can be larger, regardless of the size of the picture elements, than that in the case of using non-segregated picture element by segregating the picture element into a plurality of light emitting areas since we can shorten the width of the light emitting area against the height of the tilted reflective surface and the thickness of the optical waveguide layer. Therefore, a brighter display device is realized in comparison to other ones which consume the same electric power.

Figure 28:
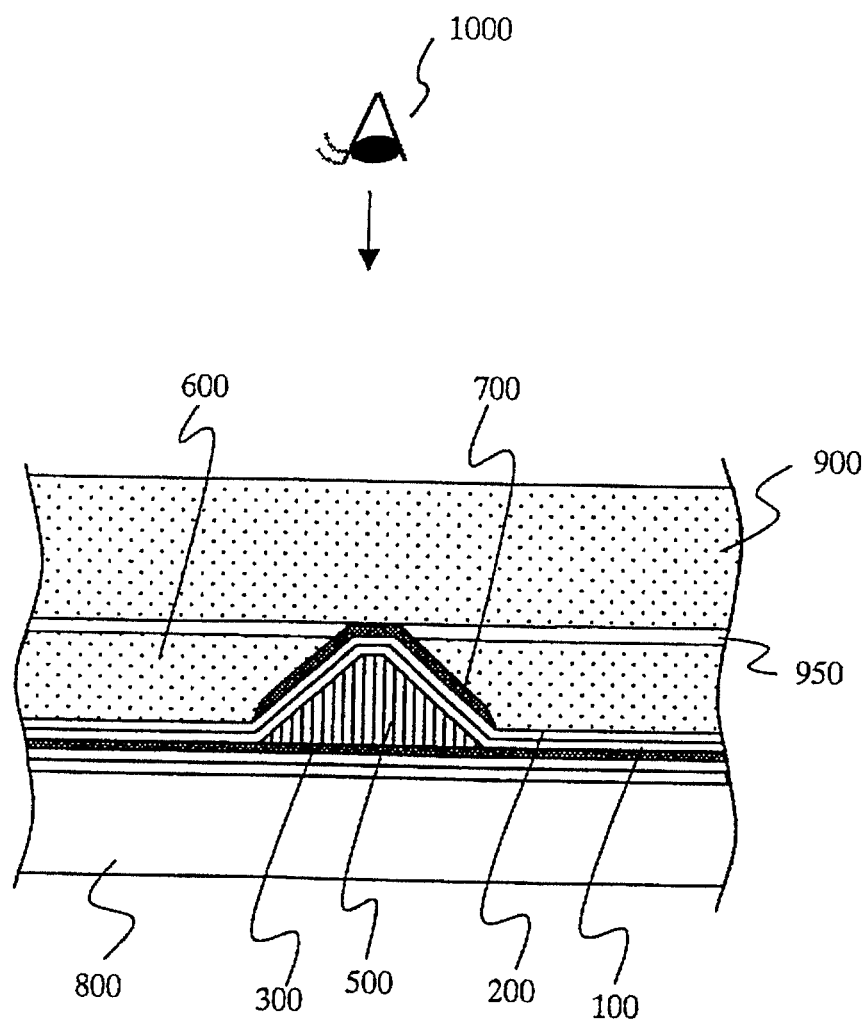
FIG. 28 is a cutaway view along C-C line shown in FIG. 27.

FIG. 28 shows the cutaway view along line C-C of an embodiment shown in FIG. 27. A picture element in this embodiment is segregated into a plurality of areas by the bank 500 as described above. In order to suppress the increase of the fraction due to the increase of the quantity of the driver elements, these segregated areas corresponding to a picture element are driven by a pair of driver elements of which configuration does not complicate the circuitry. For this purpose, the reflective electrode 20 is not segregated and a single island-shaped reflective electrode 300 is made for a single picture element 20. Therefore, the bank 500 that segregates the picture element into a plurality of areas is formed on the reflective surface 300 as shown in FIG. 28. For this embodiment, since the reflective electrode 300 connects to other portions of the electrode on the flat surface under the bank 500, therefore no failure due to the break by the step difference occurs. Moreover, the transparent electrode 200 is hard to be broken at the ridge of the bank 500 since the tilted reflective surface 700 that functions as an electrode is stacked on the transparent electrode.

Figure 29:
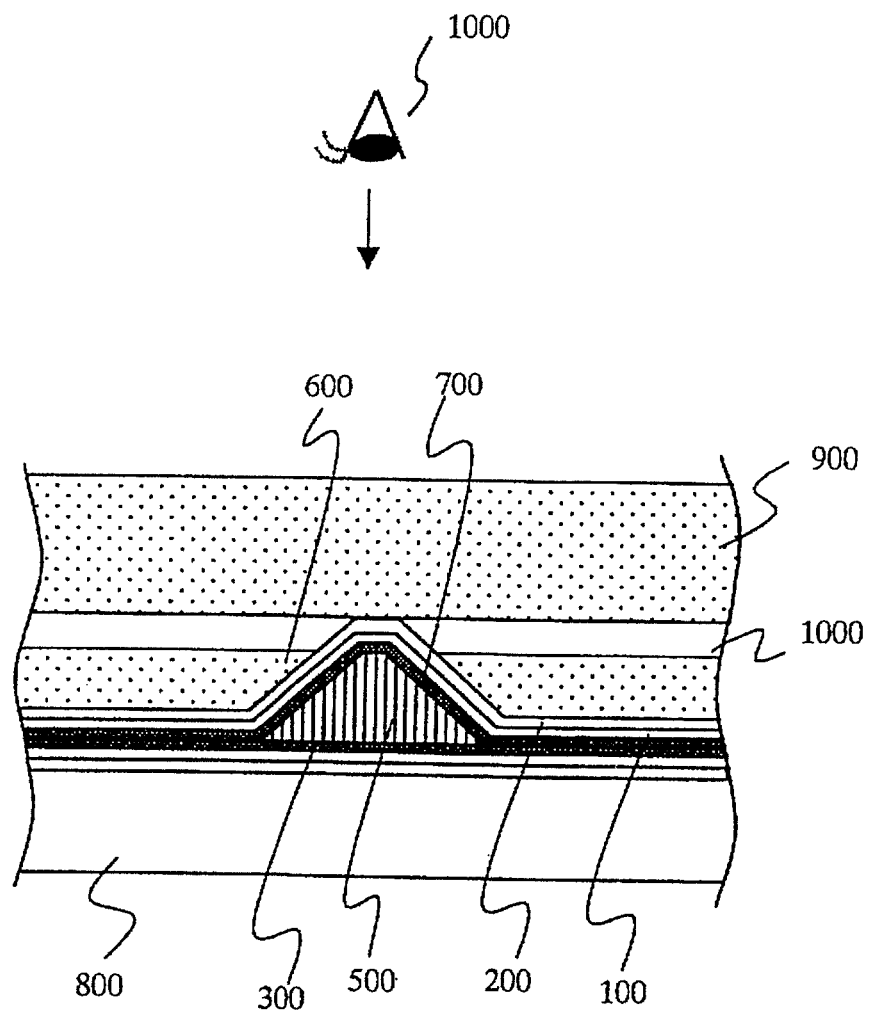
FIG. 29 is a cutaway view along C-C line shown in FIG. 27 where the embodiment shown in FIG. 23 is applied to embodiment shown in the FIG. 27.

FIG. 29 shows the cutaway view along line C-C for an embodiment shown in FIG. 27 for the embodiment shown in FIG. 23. For this embodiment, the reflective electrode is not segregated, a single island-shaped reflective electrode 300 is made for a single picture element 20 and the bank 500 that segregates the picture element into a plurality of areas is formed on the reflective electrode 300 as shown in FIG. 29. Therefore no breaking of electrode occurs due to the step difference by the bank 500 since the reflective electrode 300 connects other portions of the electrodes on the flat surface. Moreover, the shape of the pixels segregated from a picture element can be any one as a polygon as a triangle and a hexagon, an ellipsoid or a circle as far as we can obtain the desired viewing angle characteristics.

The Eighth Embodiment

Figure 30:
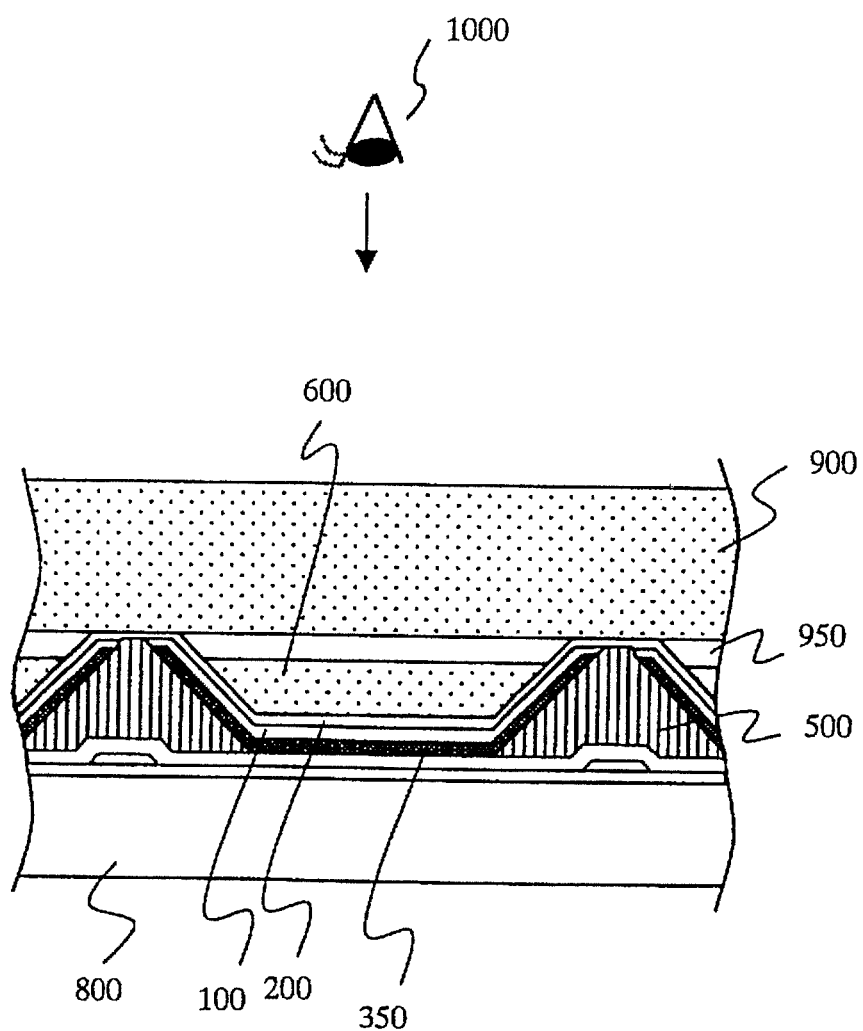
FIG. 30 is a cross sectional view of a picture element or the eighth embodiment of the display device.

Next, we will explain another embodiment. FIG. 30 shows a cross sectional view of a picture element explaining another embodiment of the display device. This embodiment is the display device where a modification is applied to the embodiment explained in FIG. 23 such that the reflective electrode is eliminated, and the tilted reflective surface 700 shown in FIG. 23 is replaced by the reflective electrode 350 that functions as the tilted reflective surface 700 shown in FIG. 30 as well. Since the other constructions are the same as the above embodiment, we use the same signs and notations for the same portions and omit detailed explanations. For this embodiment, a quantity of fabrication process reduces and the productivity is improved by high throughput because the reflective electrode and the tilted reflective surface are formed by a single layer. However, for this construction, there is a possibility of failure as no light emitted from a part of a picture element because the reflective electrode 350 tends to be broken on the ridge of the bank 500 if the picture element is segregated into a plurality of light emitting areas.

Figure 31:
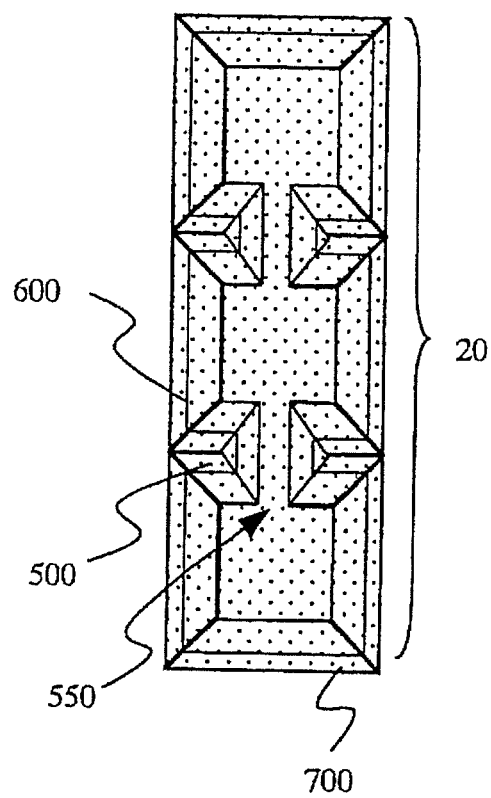
FIG. 31 is a plan view of a picture element of the eighth embodiment of the display device.

FIG. 31 shows a planar view showing a part of the display device of an embodiment. It shows a unit picture element formed of one of additive primary colors given by a red-color emission pixel, a green-color emission one and blue-color emission one therein. In this embodiment, a portion of the bank 500 that segregates the picture element into a plurality of areas as shown in the above embodiments is eliminated so that the areas are combined into a single flat surface. Therefore, the picture element is formed into a flat surface of which portions are linked by flat surface 550 which is the surface on which no bank portion exists. In other words, the reflective electrode, the organic layer and the transparent electrode are formed in a single flat plane without riding over the step difference caused by the bank. Therefore, as explained in the above embodiment by using FIG. 30, the connection of the electrode is maintained by the flat plane area even for the construction that the electrode may be cut on the ridgeline of the bank and the failure such that no light emits from a part of area of the picture element does not occur. In other words, the failure of the electrode break is prevented by eliminating a portion of the bank to make a single combined flat plan in the picture element.

The Ninth Embodiment

Figure 32:
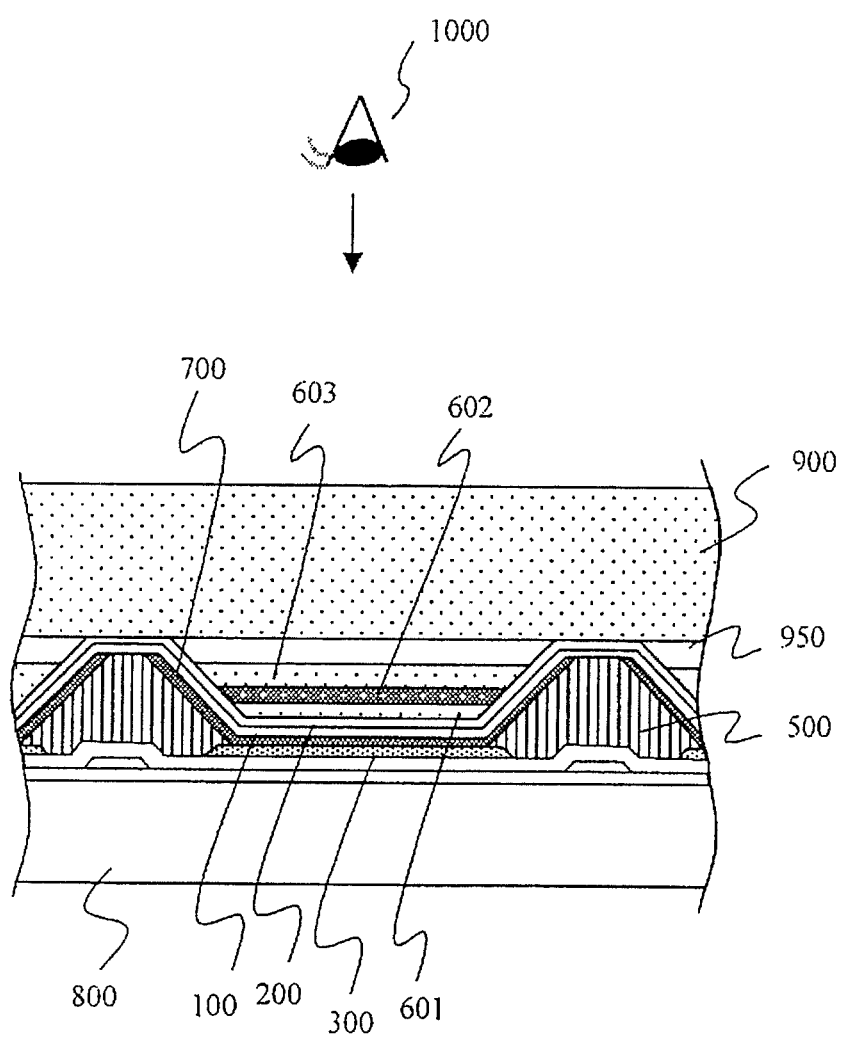
FIG. 32 is across sectional view of a picture element of the ninth embodiment of the display device.
Figure 33:
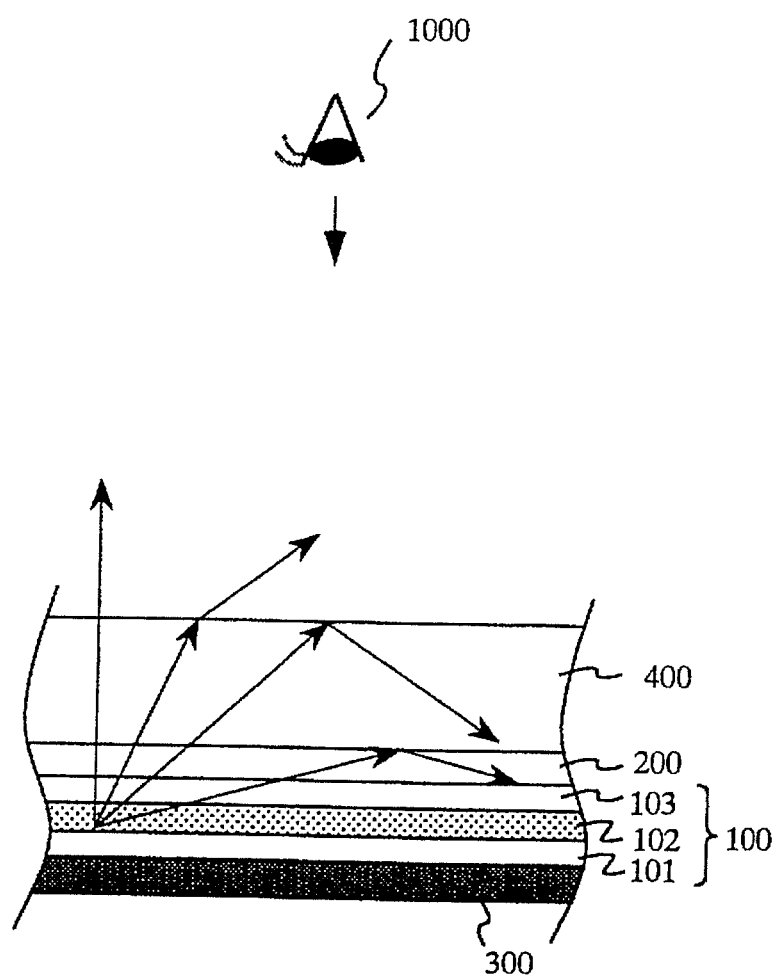
FIG. 33 is a schematic shown an example of the construction and the display operation regarding an OLED.
Figure 34:
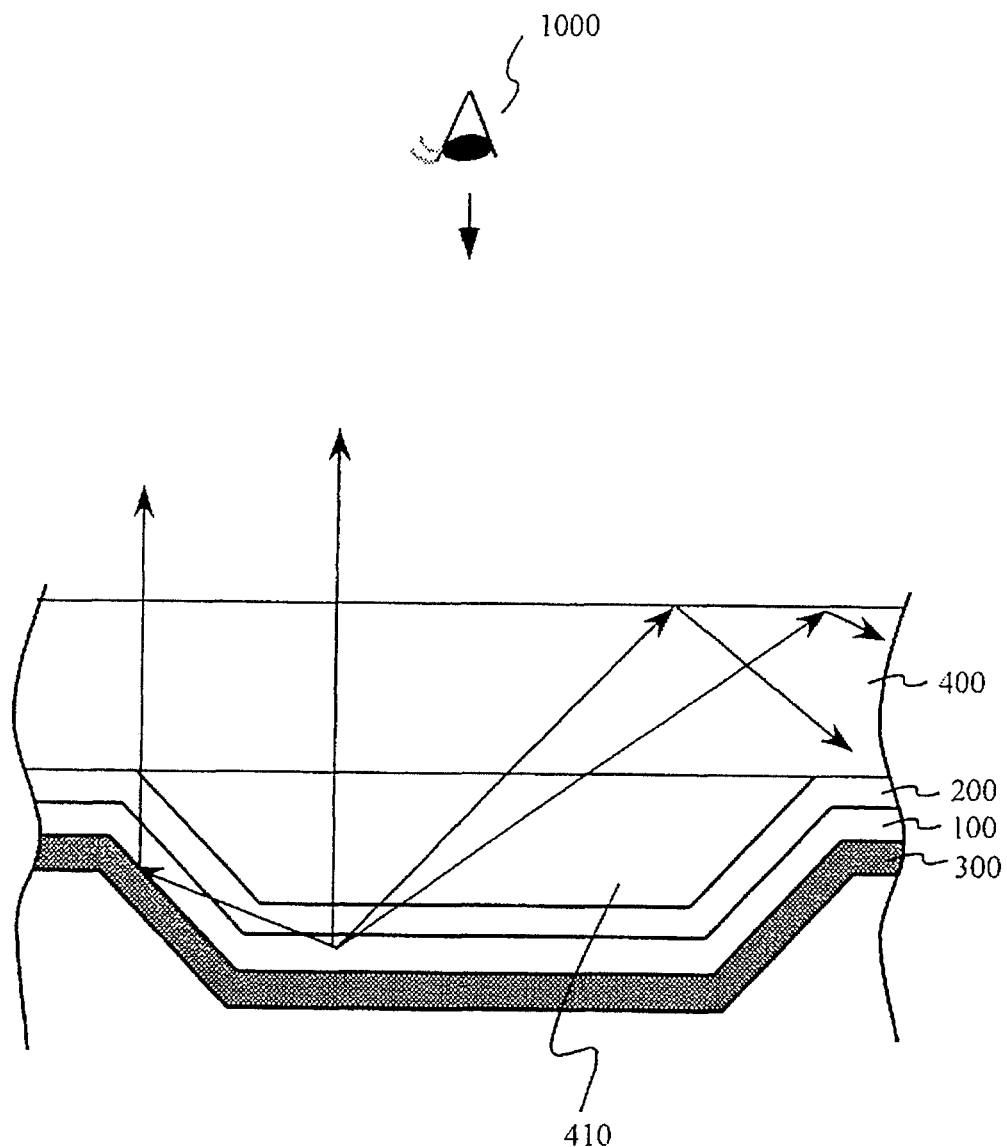
FIG. 34 schematically shows an example of a cross sectional view of an OLED.

Next, we explain another embodiment. FIG. 32 shows a cross sectional view of a picture element explaining another embodiment of the display device. This embodiment is the display device where a modification is applied to the embodiment explained in FIG. 1 such that the organic layer that is divided into a red-color pixel, green-color one and a blue-color one is made a single blue-color organic layer, and the optical waveguide layer on the area of the red-color pixel and that of the green-color pixel have color changing medium layers such as red-color fluorescence and green-color fluorescence are generated by the illumination of the blue-color light emission from the single blue-color organic layer, respectively. Since the other constructions are same as the above embodiment, we use the same signs and notations for the same portions and omit detailed explanations. Several methods for full color OLED display have already been proposed, and proven several methods for full color OLED display, among which there is a technical method of combining blue light-emitting element and fluorescent color changing media (called CCM method, hereinafter). The CCM method is to excite the fluorescent dye layer by blue light emitting from blue light emitting layer and obtain the green light and the red light converted thereby, resulting to make three primary color lights. (see The journal of the institute of image information and television engineers, Vol. 54, No. 8, pp. 1115-1120).

Next, we explain another embodiment by applying the CCM method. The picture element that emits blue light is formed, as same as the above embodiment, with a single optical waveguide layer, however the picture elements which emit red and green lights are formed with the first optical waveguide layer 601, the color changing medium layer 602 and the second optical waveguide layer 603 stacked in this order in the basin area surrounded by the bank 500.

The first and the second optical waveguide layers include transparent resin or transparent inorganic material such as silicon nitride, silicon oxide, titanium oxide, etc. In some embodiments, the refractive index of the first optical waveguide layer 601 is larger than that of the transparent electrode 200. Because the light emitted from the organic layer 100 that penetrates the transparent electrode 200 is not totally reflected at the boundary surface between the first optical waveguide layer 601 and the transparent electrode 200, is led into the color changing medium layer 602 with high efficiency, we can obtain a large external coupling efficiency by the large amount of the desired light converted in the color changing medium layer. In some embodiments, we can use titanium oxide as the higher refractive optical waveguide layer material than ITO or IZO.

In some embodiments, it is important that the heights of the color changing medium layer and the second optical waveguide layer are lower than that of the tilted reflective surface. In this embodiment, the light of the light emitted from the color changing medium layer propagates in the optical waveguide layer when it is emitted almost parallel to the surface of the optical waveguide layer, and then some portion of the light is reflected on the tilted reflective surface and goes towards the viewer 1000 as an image picture light. This reflection raises the external coupling efficiency. We can prevent the optical cross-talk and blur since the light emitting from the color changing medium 602 does not travel into other picture elements and no light travels through the other picture elements and reaches the viewer 1000 after the reflection at the tilted reflective surface surrounding the other picture elements. Therefore, we can obtain clear images and pictures and a high quality picture is realized. Though we can obtain an improvement of the external coupling efficiency without the second optical waveguide layer 603, in some embodiments, a gap 950 has a similar refractive index of air between the color changing medium layer and seal-off material. Because in embodiments of no gap, the light of the light emitted from the color changing medium layer partly travels into the seal-off material and is lost therein, or partly propagates into other picture element and comes to the viewer 1000 which results in the optical cross-talk and blur.

Next, we explain another embodiment. The embodiment is a modification applied to the above embodiments explained by referring to FIG. 1 and FIG. 2 such that the organic layer that is separately designed for a red-color light emitting picture element, green-color light emitting one and blue-color light emitting one are used for a white-color light emitting form the organic layer, the red-pigment, green-one and blue-one are mixed and dispersed in the optical waveguide layers corresponding to the red-color, the green-color and the blue-color lights emitting picture elements, respectively. Since the other constructions are same as the above embodiment, we omit detailed explanations for the portion that has the same function.

There are two kinds of the constructions; the organic layer that emits white-color light as stacked layers of which each layer has different light emission for each other and a single layer that includes different doped dies that emit different color lights. An example for the former is a combination of TPD and partly doped Alq3 with Nail red and 1,2,4-triazole derivative (TAZ). An example for the latter is doped PVK with three kinds of dopants, for example 15 1,1,4,4-tetraphenyl-1,3 butadiene, coumarin 6, DCM1. In some embodiments, for either material, the white-color light emitting organic layer has high emission efficiency and long life.

The optical waveguide layer is, as same as the embodiment explained by referring to the FIG. 16B, formed by blowing the optical waveguide layer compound material from the ink-jet head 850 to the basin area surrounded by the bank 500. In this embodiment, the optical, waveguide layer compound includes pigment other than solvent and transparent binder resin. As for the pigments included in the optical waveguide layer which is formed with the optical waveguide layer compound blown are mixed and dispersed for each picture elements as red, green and blue pigments for the picture elements for red-, green- and blue-colors, respectively. We can exploit those pigments used for the color filters applied to liquid crystal display devices.

In this embodiment, the white-color light emitted from the organic layer, directly or after reflecting on the reflective electrode, travels into the optical waveguide layer and the light of the wave-length which is different from the spectrum of the color of the included pigment filters is mostly absorbed, though, for example, the light which has the wavelength corresponding to the red-color light can penetrate the optical waveguide layer which corresponds to the red-color picture element due to inclusion of such pigment. Therefore, the light that travels to the viewer after penetrating the optical waveguide layer or traveling in the optical waveguide layer, and then reflecting on the tilted reflective surface is the red light provided it emits from the picture element designed for the red-color light emission. Similar to the red color picture element for the picture element designed for green-color or blue-color light emission, we can obtain the lights of these colors. For this embodiment, we need one organic layer, the process features to be easy fabrication since no coloring from such three primary colors for each picture element. In addition, in some embodiments, similar to the above embodiments, we can improve the external coupling efficiency by the effects of the optical waveguide layers and the tilted reflective surface and obtain high quality image which has no optical cross talk and does the clear image.

In the embodiments we have discussed, we have shown so-called active matrix type display devices such as the presentation of the image is performed by controlling the operation of a plurality of light-emitting diodes that form a plurality of picture elements aligned in a formation of matrix with the use of driver elements, however, this embodiment is not confined to such embodiments. In other words, the construction that has improved the external coupling efficiency shown in the above embodiment can be applied to so-called passive matrix type display devices and to merely illuminating devices. As for the light emitting elements, the device that light-emits in the medium which has larger refractive index than air, and that has a flat plan in at least a part of the light emitting layer, such as inorganic electro-luminescent devices or inorganic light emitting diodes, can be applied to one or more embodiments of this disclosure.

The invention claimed is:

1. A display device including a plurality of light-emitting elements aligned on a TFT substrate in a formation of a matrix, wherein the display device comprises:
   the plurality of light-emitting elements each having a flat surface portion and including a light-emitting layer, an anode, and a cathode;
   an insulating layer formed on the TFT substrate and under the light emitting element; and
   a tilted metal surface is provided on a peripheral area surrounding the flat surface portion of the light-emitting element and has a tilt angle with respect to the flat surface portion of the light-emitting element;
   wherein the tilted metal surface is provided on a surface of a slope of a bank that is provided on the insulation layer;
   wherein a width of a cross-section of the bank becomes smaller as the cross section comes farther away from a surface of the TFT substrate;
   wherein a counter substrate is placed on the TFT substrate; and
   wherein a gap exists between the light emitting element and the counter substrate.

2. The display device according to claim 1, wherein the display device comprising a plurality of pixels aligned on the TFT substrate in a formation of a matrix; and
   wherein each of the plurality of pixels includes one of the plurality of light-emitting elements.

3. The display device according to claim 1, wherein an optical waveguide layer is overlaid in an area surrounded by the tilted metal surface on the light emitting element.

4. The display device according to claim 3, wherein the optical waveguide layer has a cross sectional formation so that a cross sectional width of the optical waveguide layer becomes wider as a distance from the surface of the TFT substrate increases; and
   wherein a height of the tilted metal surface from the flat surface of the light-emitting layer is larger than a maximum height of the optical waveguide layer.

5. The display device according to claim 1, wherein inactive gas is arranged in the gap.

6. The display device according to claim 1, wherein the bank is sandwiched between the tilted metal surface and the anode in the peripheral area surrounding the flat surface portion of the light-emitting element; and
   wherein the bank is not arranged on the flat surface portion of the light-emitting element in plan view.

7. The display device according to claim 6, further comprising:
   a plurality of driver elements each connected to each of the light-emitting elements;
   a plurality of capacitor elements each of which is connected to one of the light emitting elements and receives one of a plurality of image signals; and
   a plurality of switching elements each of which is connected to one of the capacitor elements and one of the light emitting elements and controls input of one of the plurality of image signals to one of the capacitor elements;
   wherein the insulating layer has a contact hole formed on the driver element;
   wherein the anode is formed on the insulation layer and is connected to the driver element via the contact hole;
   wherein the bank is formed to cover the contact hole.

8. A display device including a plurality of light-emitting elements having a flat surface portion and including an organic layer, an anode and a cathode;
   an insulating layer formed on the TFT substrate and under the light emitting element;
   a first metal surface is provided on a surface of a slope of a first bank that is provided on the insulation layer;
   a second metal surface is provided on a surface of a slope of a second bank that is provided on the insulation layer;
   wherein the flat surface portion of the light-emitting element is arranged between the first metal surface and the second metal surface;
   wherein a width of a cross section of each of the first and the second banks becomes smaller as the cross section comes farther away from a surface of the TFT substrate;
   wherein a counter substrate is placed on the TFT substrate; and
   wherein a gap exist between the light emitting element and the counter substrate.

9. The display device according to claim 8, wherein the anode, the organic layer including a light-emitting layer, and the cathode is arranged in this order;
   wherein at the flat surface portion of the light-emitting element, the anode is connected to the organic layer, and the organic layer is connected to the cathode.

10. The display device according to claim 9, wherein an optical waveguide layer is overlaid on the flat surface portion of the light-emitting element.

11. The display device according to claim 10, wherein the optical waveguide layer has a cross sectional formation so that a cross sectional width of the optical waveguide layer becomes wider as a distance from the surface of the TFT substrate increases; and
   wherein a height of the tilted metal surface from the flat surface portion of the light-emitting element is larger than a maximum height of the optical waveguide layer.

12. The display device according to claim 8, wherein inactive gas is arranged in the gap.

13. The display device according to claim 9, wherein the first and the second banks are formed in an integrated manner;

wherein a peripheral region of the anode surrounds the flat surface portion of the light-emitting element in plan view; and wherein the first bank is arranged between the first metal surface and the peripheral region of the anode, and the second bank is arranged between the second metal surface and the peripheral region of the anode.

14. The display device according to claim 13, further comprising:
a plurality of driver elements each connected to each of the light-emitting elements;
a plurality of capacitor elements each of which is connected to each of the light emitting elements and receives each of a plurality of image signals; and
a plurality of switching elements each of which is connected to one of the capacitor elements and one of the light emitting elements and controls input of one of the plurality of image signals to one of the capacitor elements;
wherein the insulating layer has a contact hole formed on the driver element;
wherein the anode is formed on the insulation layer;
wherein the peripheral region of the anode is connected to the driver element via the contact hole;
wherein the first bank is formed to cover the contact hole.

15. The display device according to claim 13, wherein the first metal surface is provided on a peripheral area surrounding the flat surface portion of the light-emitting element and has a first tilt angle with respect to the flat surface portion of the light-emitting element;
wherein the second metal surface is provided in the peripheral area surrounding the flat surface portion of the light-emitting element and has a second tilt angle with respect to the flat surface portion of the light-emitting element; and
wherein the first and the second banks includes the peripheral area formed on the peripheral region of the anode.

16. A display device including a plurality of light-emitting elements aligned on a TFT substrate in a formation of a matrix, wherein the display device comprises:
at least one of the plurality of light-emitting elements having a flat surface portion and including an organic layer, an anode and a cathode;
an insulation layer formed on the TFT substrate and under the light emitting element;
a metal surface is provided on a surface of an insulation bank that is provided on the insulating layer;

wherein each of the insulating bank and the metal surface surrounds the flat surface portion of the light-emitting element in plan view;
wherein a width of a cross section of the insulation bank becomes smaller as the cross section comes farther away from a surface of the TFT substrate;
wherein a counter substrate is placed on the TFT substrate; and
wherein gap exist between the light emitting element and the counter substrate.

17. The display device according to claim 16, wherein the anode, the organic layer including a light-emitting layer, and the cathode is arranged in this order;
wherein at the flat surface portion of the light-emitting element, the anode is connected to the organic layer, and the organic layer is connected to the cathode.

18. The display device according to claim 17, wherein a peripheral region of the anode surrounds the flat surface portion of the light-emitting element in plan view; and
wherein the insulation bank is arranged between the metal surface and the peripheral region of the anode.

19. The display device according to claim 16, further comprising:
a plurality of driver elements each connected to each of the light-emitting elements;
a plurality of capacitor elements each of which is connected to one of the light emitting elements and receives each of a plurality of image signals; and
a plurality of switching elements one of which is connected to one of the capacitor elements and one of the light emitting elements and controls input of one of the plurality of image signals to one of the capacitor elements;
wherein the insulation layer has a contact hole formed on the driver element;
wherein the anode is formed on the insulation layer;
wherein the peripheral region of the anode is connected to the driver element via the contact hole; and
wherein the insulation bank is formed to cover the contact hole.

20. The display device according to claim 18, wherein the metal surface is provided on a peripheral area surrounding the flat surface portion of the light-emitting element and has a tilt angle with respect to the flat surface portion of the light-emitting element; and
wherein the insulation bank includes the peripheral area formed on the peripheral region of the anode.

* * * * *